US012243823B2

(12) United States Patent
Chen et al.

(10) Patent No.: US 12,243,823 B2
(45) Date of Patent: Mar. 4, 2025

(54) SEMICONDUCTOR DEVICE HAVING BACKSIDE GATE CONTACT

(71) Applicant: Taiwan Semiconductor Manufacturing Co., Ltd., Hsinchu (TW)

(72) Inventors: Chun-Yuan Chen, Hsinchu (TW); Huan-Chieh Su, Hsinchu (TW); Cheng-Chi Chuang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 573 days.

(21) Appl. No.: 17/476,962

(22) Filed: Sep. 16, 2021

(65) Prior Publication Data

US 2022/0352074 A1    Nov. 3, 2022

Related U.S. Application Data

(60) Provisional application No. 63/181,719, filed on Apr. 29, 2021.

(51) Int. Cl.
| | |
|---|---|
| *H01L 29/06* | (2006.01) |
| *H01L 21/02* | (2006.01) |
| *H01L 21/8234* | (2006.01) |
| *H01L 23/535* | (2006.01) |
| *H01L 27/088* | (2006.01) |
| *H01L 29/417* | (2006.01) |
| *H01L 29/423* | (2006.01) |

(Continued)

(52) U.S. Cl.
CPC ........ *H01L 23/535* (2013.01); *H01L 21/0259* (2013.01); *H01L 21/823412* (2013.01); *H01L 21/823418* (2013.01); *H01L 21/823475* (2013.01); *H01L 21/823481* (2013.01); *H01L 27/088* (2013.01); *H01L 29/0665* (2013.01); *H01L 29/41733* (2013.01); *H01L 29/42392* (2013.01); *H01L 29/66545* (2013.01); *H01L 29/66742* (2013.01); *H01L 29/78696* (2013.01)

(58) Field of Classification Search
None
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |

(Continued)

*Primary Examiner* — Joseph C. Nicely
*Assistant Examiner* — E. Rhett Cheek
(74) *Attorney, Agent, or Firm* — Seed IP Law Group

(57) ABSTRACT

An integrated circuit includes a substrate at a front side of the integrated circuit. A first gate all around transistor is disposed on the substrate. The first gate all around transistor includes a channel region including at least one semiconductor nanostructure, source/drain regions arranged at opposite sides of the channel region, and a gate electrode. A shallow trench isolation region extends into the integrated circuit from the backside. A backside gate plug extends into the integrated circuit from the backside and contacts the gate electrode of the first gate all around transistor. The backside gate plug laterally contacts the shallow trench isolation region at the backside of the integrated circuit.

20 Claims, 30 Drawing Sheets

(51) Int. Cl.
    *H01L 29/66*     (2006.01)
    *H01L 29/786*    (2006.01)

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 12,068,321 B2 * | 8/2024 | Kim .................. H01L 29/78684 |
| 2018/0122938 A1 * | 5/2018 | Cheng ................ H01L 29/7827 |
| 2018/0261516 A1 * | 9/2018 | Lin ................... H01L 21/02603 |
| 2018/0315838 A1 * | 11/2018 | Morrow .......... H01L 21/823842 |
| 2019/0318970 A1 * | 10/2019 | Lee ..................... H01L 29/6656 |
| 2020/0294998 A1 * | 9/2020 | Lilak ................. H01L 23/53295 |
| 2021/0043522 A1 * | 2/2021 | Chanemougame .......................... H01L 27/0688 |
| 2021/0408246 A1 * | 12/2021 | Ganguly ........... H01L 21/02532 |
| 2022/0139911 A1 * | 5/2022 | Wei ................... H01L 29/78696 257/365 |
| 2024/0347610 A1 * | 10/2024 | Ganguly ........... H01L 21/02603 |

\* cited by examiner

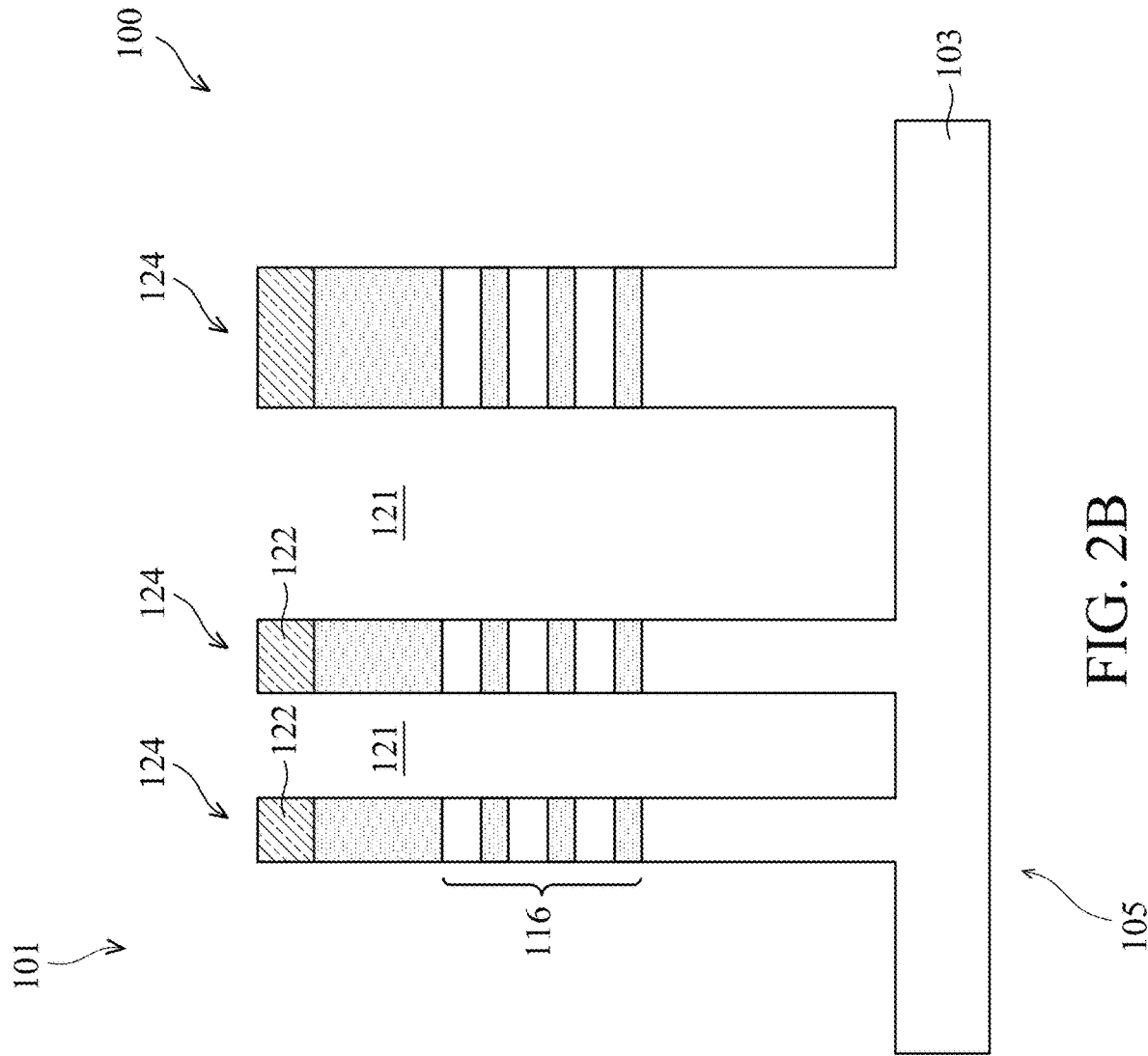

FIG. 2H

SEMICONDUCTOR DEVICE HAVING BACKSIDE GATE CONTACT

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Gate electrodes may be coupled to the nanostructures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
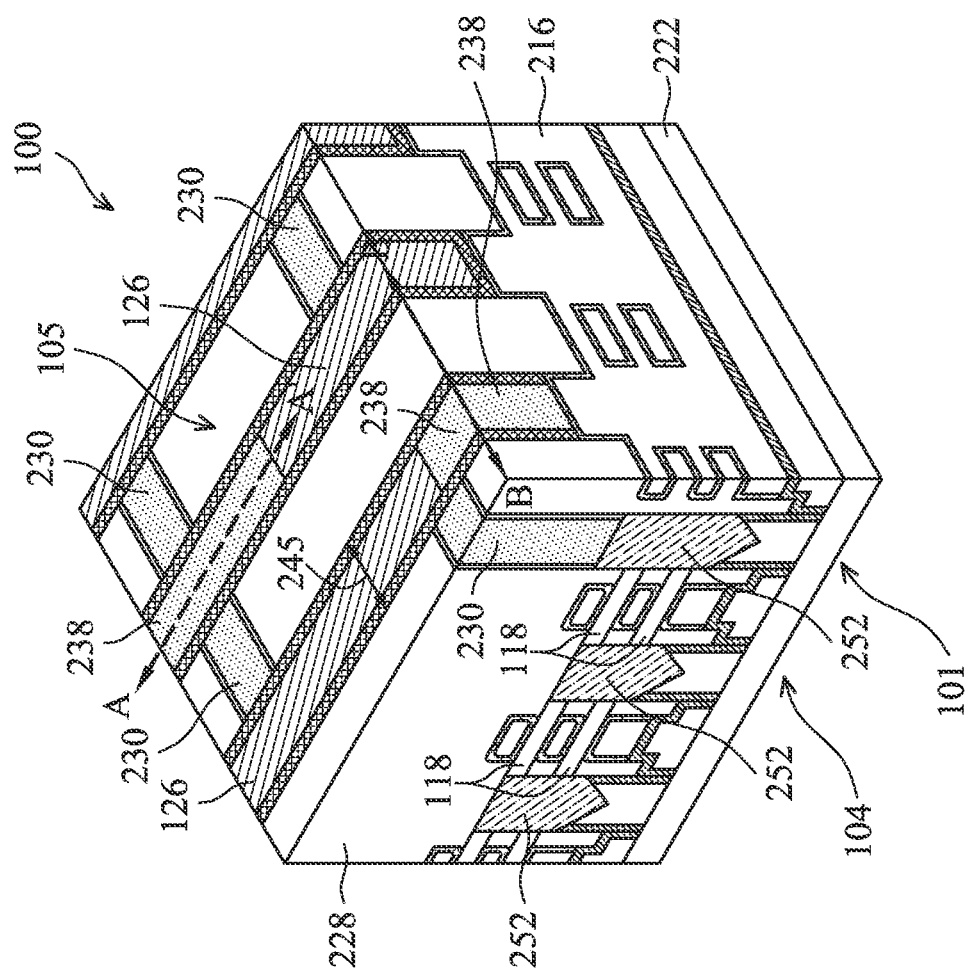
FIG. 1A of an integrated circuit.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide integrated circuits and methods of manufacturing integrated circuits in which backside metal gate plugs are formed extending into the integrated circuits from a backside thereof. The integrated circuit includes one or more transistors. The transistors each have a plurality of nanostructures formed over a substrate. The nanostructures act as channel regions of the transistor. Each transistor includes a gate electrode over the channel region. The backside metal gate plugs contact gate electrodes of one or more of the transistors of the integrated circuit. In some embodiments, backside source/drain plugs are formed which extend into the integrated circuit from the backside and contact source/drain regions of the transistors. By forming the backside metal gate plugs and the backside source/drain plugs at the backside of the integrated circuit, metal routing with the gate electrodes may be performed at the backside of the integrated circuit. This results in a reduction of routing density at the front side of the integrated circuit, which facilitates miniaturization of the integrated circuit. Furthermore, the reduction of routing density reduces or eliminates current leakage or short-circuits between metal lines that would otherwise exist if the metal lines are too close to one another, for example, if the metal lines are all formed at the front side of the integrated circuit.

Figure 1B:
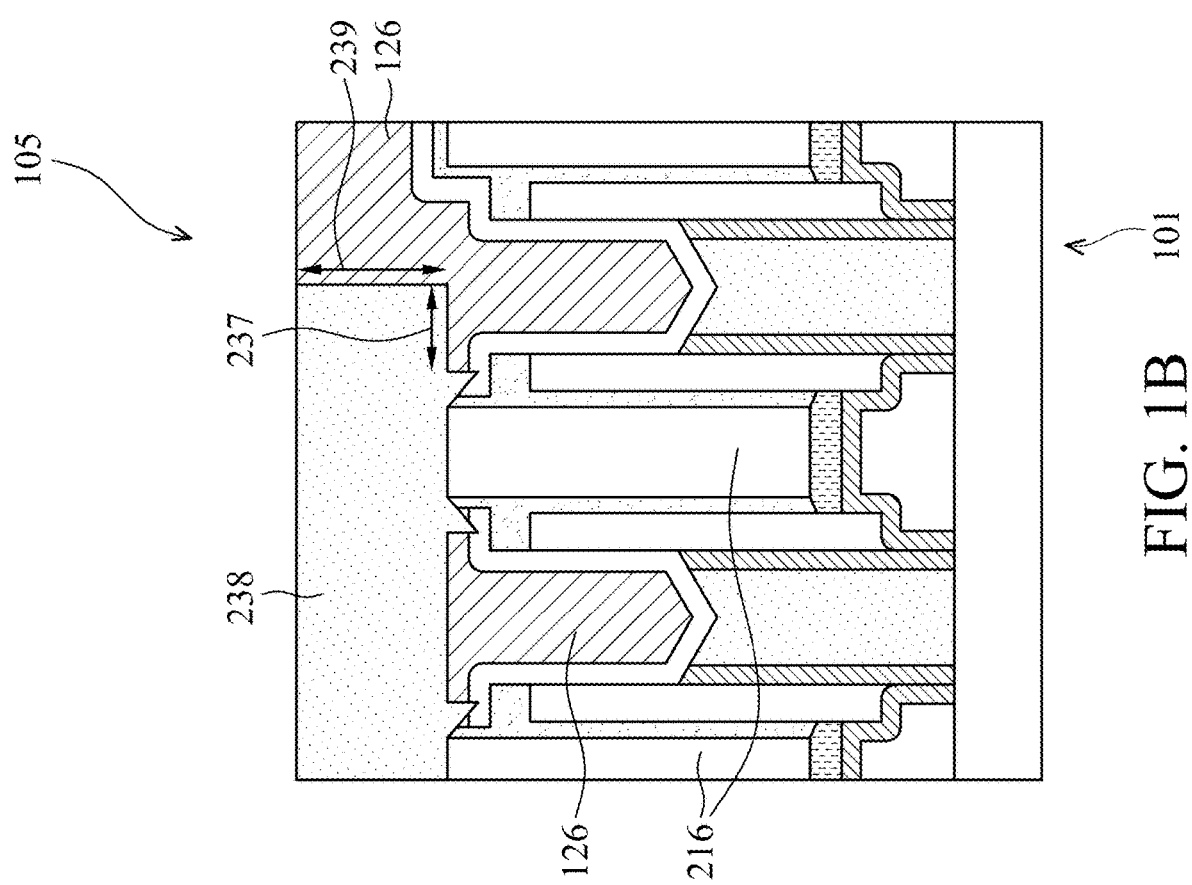
FIG. 1B is a cross-sectional diagram of the integrated circuit taken along the line A-A'.
Figure 1C:
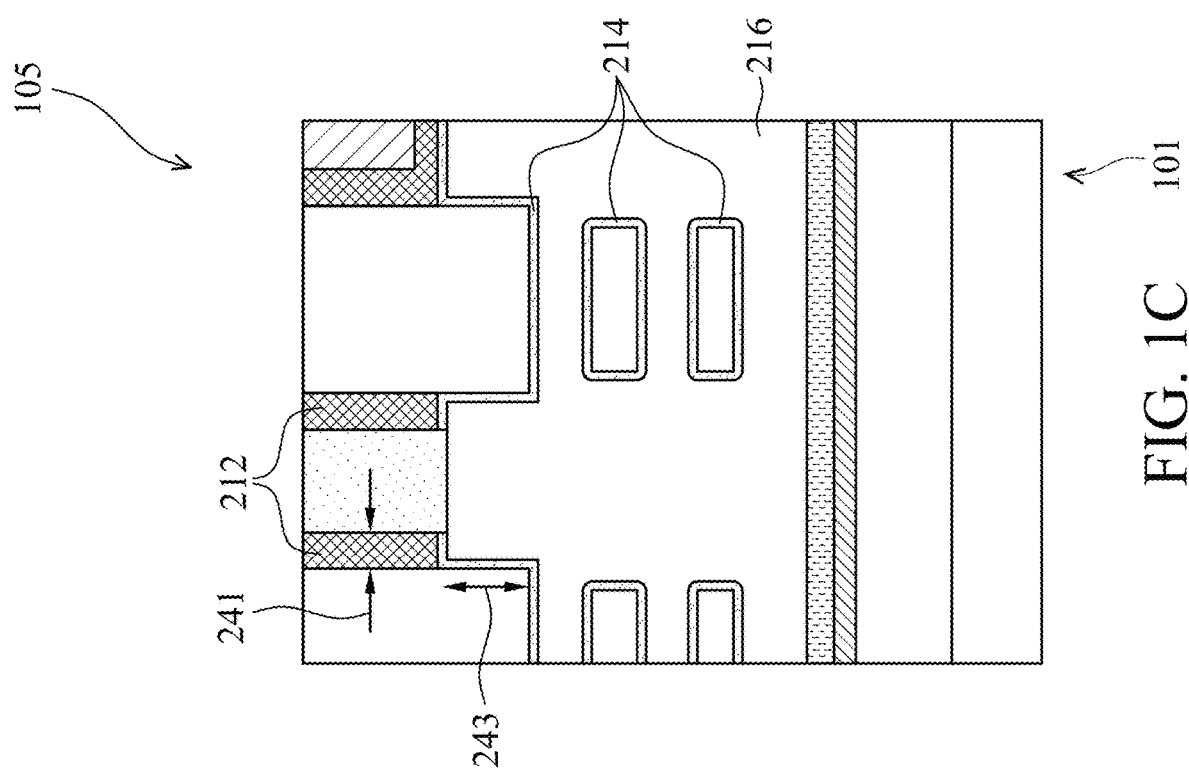
FIG. 1C is a cross-sectional diagram of the integrated circuit taken along the line B-B', in accordance with some embodiments.

FIG. 1A is a schematic diagram illustrating an integrated circuit 100, in accordance with some embodiments. FIG. 1B is a cross-sectional diagram illustrating the integrated circuit 100 taken along the line A-A'. FIG. 1C is a cross-sectional diagram illustrating the integrated circuit 100 taken along the line B-B'.

The integrated circuit 100 has a front side 101 and a backside 105. In some embodiments, the integrated circuit 100 includes a plurality of transistors 104. In some embodiments, a substrate forms the front side 101 of the integrated circuit 100. In some embodiments, the substrate may be a dielectric layer 222, which may include silicon nitride or another suitable material.

The integrated circuit 100 includes backside metal gate plugs 238 which extend into the integrated circuit 100 from the backside 105 and contact and electrically connect to one or more gate electrodes 216 of the plurality of transistors included in the integrated circuit 100. In some embodiments, the integrated circuit 100 further includes one or more backside source/drain plugs 230 which extend into the integrated circuit 100 from the backside 105 and contact and electrically connect to one or more source/drain regions of the plurality of transistors included in the integrated circuit 100.

The gate electrodes 216 may be formed of any suitable electrically conductive material. In some embodiments, the gate electrodes 216 are formed of one or more of titanium (Ti), titanium nitride (TiN), or tungsten (W), and in some embodiments, the gate electrodes 216 may include one or more dopant materials, such as lanthanum (La), zirconium (Zr), or hafnium (Hf). In some embodiments, the gate electrodes 216 may have a recess depth 243, as shown in FIG. 1C. In some embodiments, the recess depth 243 is less than 10 nm. In some embodiments, the recess depth 243 is within a range from about 0 nm to about 10 nm.

In some embodiments, each of the plurality of transistors are nanostructure transistors. In such embodiments, channel regions of each of the transistors include a plurality of semiconductor nanostructures 118 extending between the source/drain regions 252 of the transistors. The semiconductor nanostructures 118 may include nanosheets, nanowires, or other types of nanostructures. The semiconductor nanostructures 118 form channel regions of each of the transistors. Other types of transistors may be utilized without departing from the scope of the present disclosure. A number of the semiconductor nanostructures 118 included in the channel region of each transistor may vary in various embodiments. In some embodiments, the channel region of each transistor may include one or more semiconductor nanostructures 118. In some embodiments, the channel region of each transistor may include anywhere from one to five or more semiconductor nanostructures 118. The semiconductor nanostructures 118 of the channel region of each transistor may be arranged in a stacked arrangement, such that the nanostructures 118 are substantially vertically aligned and overlapping with one another.

In some embodiments, a gate dielectric 214 is disposed on the gate electrodes 216 and may surround (e.g., surround at least four sides) portions of the gate electrodes 216 disposed between the nanostructures 118 of each of the transistors. In various embodiments, the gate dielectric 214 may be formed of a single layer or multiple dielectric layers, as will be described in further detail later herein.

A dielectric material 228 forms a part of a surface of the integrated circuit 100 at the back 105. In some embodiments, the dielectric material 228 is disposed on the gate electrodes 216 and on the source/drain regions 252. As shown in FIGS. 1A through 1C, a dielectric liner 212 may be formed on lateral surfaces of the dielectric material 228, and the backside metal gate plugs 238 and the backside source/drain plugs 230 are formed in regions between facing portions of the dielectric liner 212, for example, in contact with the dielectric liner 212. In some embodiments, the dielectric liner 212 has a width 241 that is within a range from about 4 nm to about 10 nm. The width 241 of the dielectric liner 212 within this range provides suitable electrical isolation between the backside metal gate plugs 238 and adjacent electrical features, such as the backside source/drain plugs 230. In some embodiments, the dielectric liner 212 may be formed of a same material as the dielectric layer 222.

In some embodiments, the dielectric material 228 is formed of a material suitable to reduce or lower parasitic capacitance, e.g., between neighboring transistors. In some embodiments, the dielectric material 228 is or includes $SiO_xN_yC_z$ or other dielectrics, and in some embodiments, the dielectric material 228 is SiN. In various embodiments, the dielectric material 228 may be formed as a multi-layer or a single layer.

Shallow trench isolation regions 126 form a part of the surface of the integrated circuit 100 at the backside 105. The shallow trench isolation regions 126 can be utilized to separate individual transistors or groups of transistors groups of transistors formed in conjunction with the semiconductor substrate 102. The dielectric material for the shallow trench isolation regions 126 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD.

In some embodiments, the shallow trench isolation regions 126 may have a width 245 that is less than 100 nm. In some embodiments, the width 245 of the shallow trench isolation regions 126 may be less than 50 nm. In some embodiments, the width 245 of the shallow trench isolation regions 126 may be within a range from about 10 nm to about 100 nm. The shallow trench isolation regions 126 having a width 245 within this range provide suitable electrical isolation between electrical features (e.g., between neighboring gate electrodes 216), while having a reduced size which results in space savings.

As shown in FIGS. 1A through 1C, the backside metal gate plugs 238 may be formed in contact with the shallow trench isolation regions 126. The backside metal gate plugs 238 may be formed of any suitable electrically conductive material. In some embodiments, the backside metal gate plugs 238 are formed of Ru, W, Co, Al, or Mo, or any compounds including ruthenium (Ru), tungsten (W), cobalt (Co), aluminum (Al), or molybdenum (Mo). In some embodiments, the backside metal gate plugs 238 may be formed on a liner, which may include titanium (Ti), tantalum (Ta), titanium nitride (TiN), or tantalum nitride (TaN). In some embodiments, the liner is optional.

The backside source/drain plugs 230 may be formed of any suitable electrically conductive material. In some embodiments, the backside source/drain plugs 230 are formed of Ru, W, Co, Al, or Mo, or any compounds including Ru, W, Co, Al, or Mo. In some embodiments, the backside source/drain plugs 230 may be formed on a liner, which may include Ti, Ta, TiN, or TaN. In some embodiments, the liner is optional. In some embodiments, the backside source/drain plugs 230 contact the source/drain regions 252, which may be epitaxially grown regions. The backside source/drain plugs 230 are electrically or conductively coupled to the source/drain regions 252.

In some embodiments, two or more gate electrodes 216 (e.g., gate electrodes of two or more transistors) of the integrated circuit 100 may be electrically connected to one another by one of the backside metal gate plugs 238, for example, as shown in FIG. 1B. In some embodiments, one or more of the backside source/drain plugs 230 may be connected (e.g., electrically coupled or connected) to one or more of the gate electrodes 216 through the backside metal gate plugs 238.

In some embodiments, the backside metal gate plugs 238 may have an enclosure budget with respect to the gate electrodes 216. For example, as shown in FIG. 1B, the backside metal gate plugs 238 may extend laterally outwardly beyond an edge of the gate electrode 216 to a distance 237 that is less than 30 nm. In some embodiments, the distance 237 is within a range from about 0 to about 30 nm. The enclosure budget may be a result of formation of the backside metal gate plugs 238 (as shown, for example, in FIG. 3K) in which portions of the shallow trench isolation regions 126 are removed and refilled by the backside metal gate plugs 238. moreover, the enclosure budget of the backside metal gate plugs 238 may result in reliable formation of the backside metal gate plugs 238, and may ensure reliable electrical contact between the backside metal gate plugs 238 and the gate electrodes 216.

In some embodiments, the backside metal gate plugs 238 may be formed to have a height 239 that is less than 50 nm. In some embodiments, the height 239 of the backside metal gate plugs 238 may be within a range from about 10 nm to about 30 nm. This results in good electrical connection to the gate electrodes 216, while also providing low profile backside metal gate plugs 238, which results in space savings.

By forming the backside metal gate plugs 238 and the backside source/drain plugs 230 at the backside 105 of the integrated circuit 100, metal routing with the gate electrodes 216 (e.g., between two or more of the gate electrodes 216 or between the gate electrodes 216 and the backside source/drain plugs 230) may be performed at the backside 105 of the integrated circuit 100. This results in a reduction of routing density at the front side 101 of the integrated circuit 100, which facilitates miniaturization of the integrated circuit 100 including a plurality of transistors. Moreover, the reduction of routing density reduces or eliminates current leakage or short-circuits between metal lines that would otherwise exist if the metal lines are too close to one another, for example, if the metal lines are all formed at the front side 101 of the integrated circuit 100.

FIGS. 2A-3L are cross-sectional views of the integrated circuit 100 at various stages of processing, according to some embodiments. FIGS. 2A-3L illustrate an exemplary process for producing an integrated circuit that includes nanostructure transistors. FIGS. 2A-3L illustrate how these transistors can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

Figure 2A:
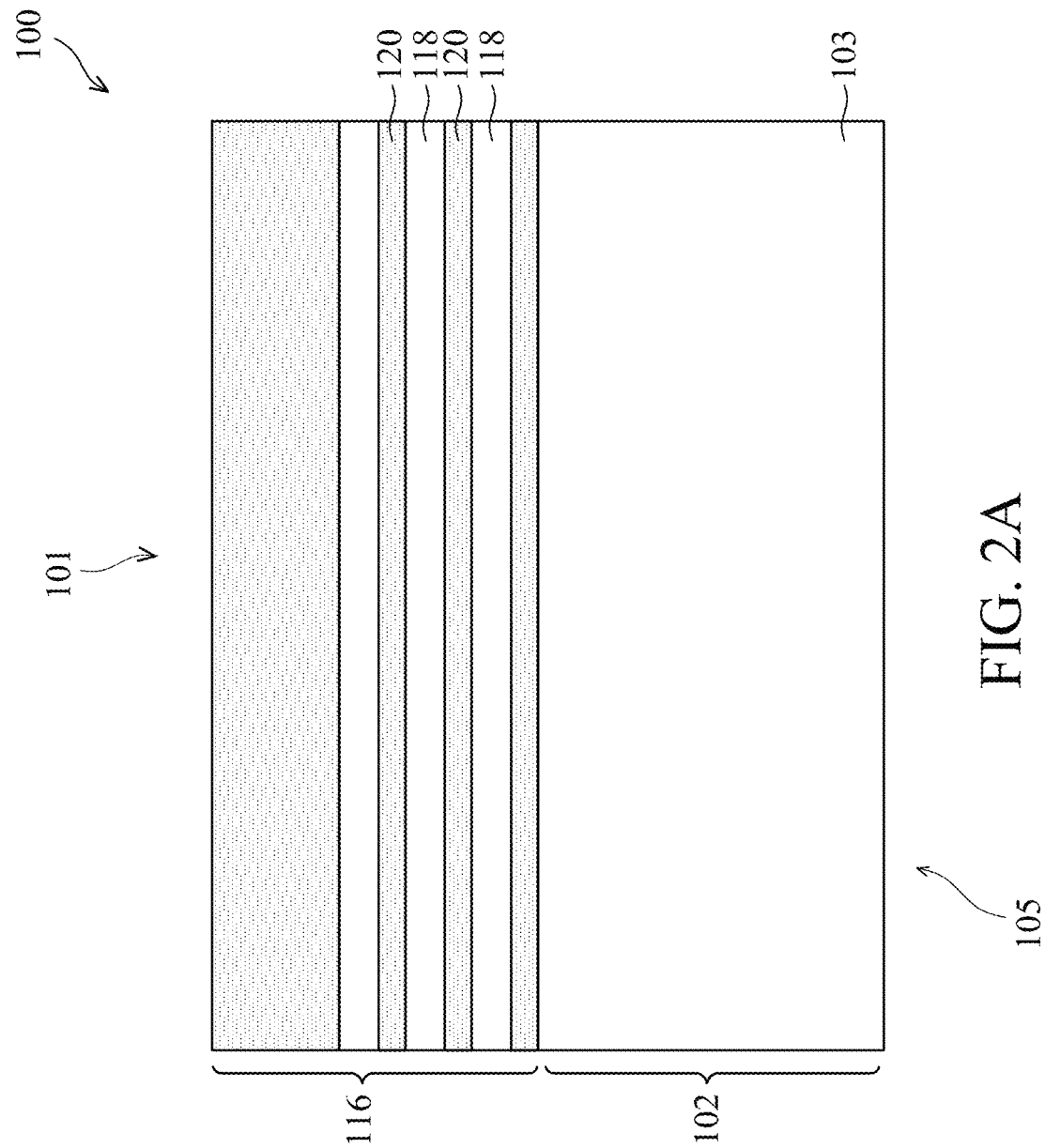
FIGS. 2A-3L are cross-sectional and perspective views of an integrated circuit at various stages of processing, in accordance with some embodiments.

In FIG. 2A, the integrated circuit 100 includes a semiconductor substrate 102. In one embodiment, the substrate 102 includes a semiconductor material 103. The semiconductor material 103 may include a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 includes a semiconductor stack 116 on the substrate 102. The semiconductor stack 116 includes a plurality of semiconductor layers 118. The semiconductor layers 118 are layers of semiconductor material. The semiconductor layers 118 correspond to the channel regions of the gate all around transistors that will result from the process described. The semiconductor layers 118 are formed over the substrate 102. The semiconductor layers 118 may include one or more layers of Si, Ge, SiGe, GaAs, InSb, GaP, GaSb, InAlAs, InGaAs, GaSbP, GaAsSb or InP. In one embodiment, the semiconductor layers 118 are the same semiconductor material as the substrate 102. Other semiconductor materials can be utilized for the semiconductor layers 118 without departing from the scope of the present disclosure. In a primary non-limiting example described herein, the semiconductor layers 118 and the substrate 102 are silicon.

The integrated circuit 100 includes a plurality of sacrificial semiconductor layers 120 positioned between the semiconductor layers 118. The sacrificial semiconductor layers 120 include a different semiconductor material than the semiconductor layers 118. In an example in which the semiconductor layers 118 include silicon, the sacrificial semiconductor layers 120 may include SiGe. In one example, the silicon germanium sacrificial semiconductor layers 120 may include between 20% and 30% germanium, though other concentrations of germanium can be utilized without departing from the scope of the present disclosure. The concentration of germanium in the silicon germanium sacrificial semiconductor layers 120 is selected to be different than the concentration of germanium in a subsequently formed SiGe sacrificial cladding. The compositions of the sacrificial semiconductor layers 120 and the sacrificial cladding are selected to result in different etching characteristics. The purpose and benefits of this will be described in further detail below.

In one embodiment, the semiconductor layers 118 and the sacrificial semiconductor layers 120 are formed by alternating epitaxial growth processes from the semiconductor substrate 102. For example, a first epitaxial growth process may result in the formation of the lowest sacrificial semiconductor layer 120 on the top surface of the substrate 102. A second epitaxial growth process may result in the formation of the lowest semiconductor layer 118 on the top surface of the lowest sacrificial semiconductor layer 120. A third epitaxial growth process results in the formation of the second lowest sacrificial semiconductor layer 120 on top of the lowest semiconductor layer 118. Alternating epitaxial growth processes are performed until a selected number of semiconductor layers 118 and sacrificial semiconductor layers 120 have been formed.

The vertical thickness of the semiconductor layers 118 can be between 2 nm and 15 nm, in some embodiments. The thickness of the sacrificial semiconductor layers 120 can be between 5 nm and 15 nm, in some embodiments. Other thicknesses and materials can be utilized for the semiconductor layers 118 and the sacrificial semiconductor layers 120 without departing from the scope of the present disclosure.

As will be set forth in more detail below, the sacrificial semiconductor layers 120 will be patterned to become semiconductor nanostructures of gate all around transistors. The semiconductor nanostructures will correspond to channel regions of the gate all around transistors.

In one embodiment, the sacrificial semiconductor layers 120 correspond to a first sacrificial epitaxial semiconductor region having a first semiconductor composition. In subsequent steps, the sacrificial semiconductor layers 120 will be removed and replaced with other materials and structures. For this reason, the semiconductor layers 120 are described as sacrificial.

In FIG. 2B, trenches 121 have been formed in the sacrificial semiconductor layers 120, the semiconductor layers 118, and in the substrate 102. The trenches 121 can be formed by depositing a hard mask layer 122 on the top sacrificial semiconductor layer 120. The hard mask layer 122 is patterned and etched using standard photolithography processes. After the hard mask layer 122 has been patterned and etched, the sacrificial semiconductor layers 120, the semiconductor layers 118, and the substrate 102 are etched at the locations that are not covered by the hard mask layer 122. The etching process results in formation of the trenches 121. The etching process can include multiple etching steps. For example, a first etching step can etch the top semiconductor layer 118. A second etching step can etch the top sacrificial semiconductor layer 120. These alternating etching steps can repeat until all of the sacrificial semiconductor layers 120 and semiconductor layers 118 are etched at the exposed regions. The final etching step may etch the substrate 102. In other embodiments, the trenches 121 may be formed in a single etching process.

The trenches 121 define three fins 124 of semiconductor layers 118 and sacrificial semiconductor layers 120. Each of these fins 124 corresponds to a separate gate all around transistor that will eventually result from further processing steps described herein. In particular, the semiconductor layers 118 in each column or stack will correspond to the channel regions of a particular gate all around nanosheet transistor.

The hard mask layer 122 can include one or more of aluminum, AlO, SiN, or other suitable materials. The hard mask layer 122 can have a thickness between 5 nm and 50 nm, in some embodiments. The hard mask layer 122 can be deposited by a PVD process, an ALD process, a CVD process, or other suitable deposition processes. The hard mask layer 122 can have other thicknesses, materials, and deposition processes without departing from the scope of the present disclosure.

Figure 2C:
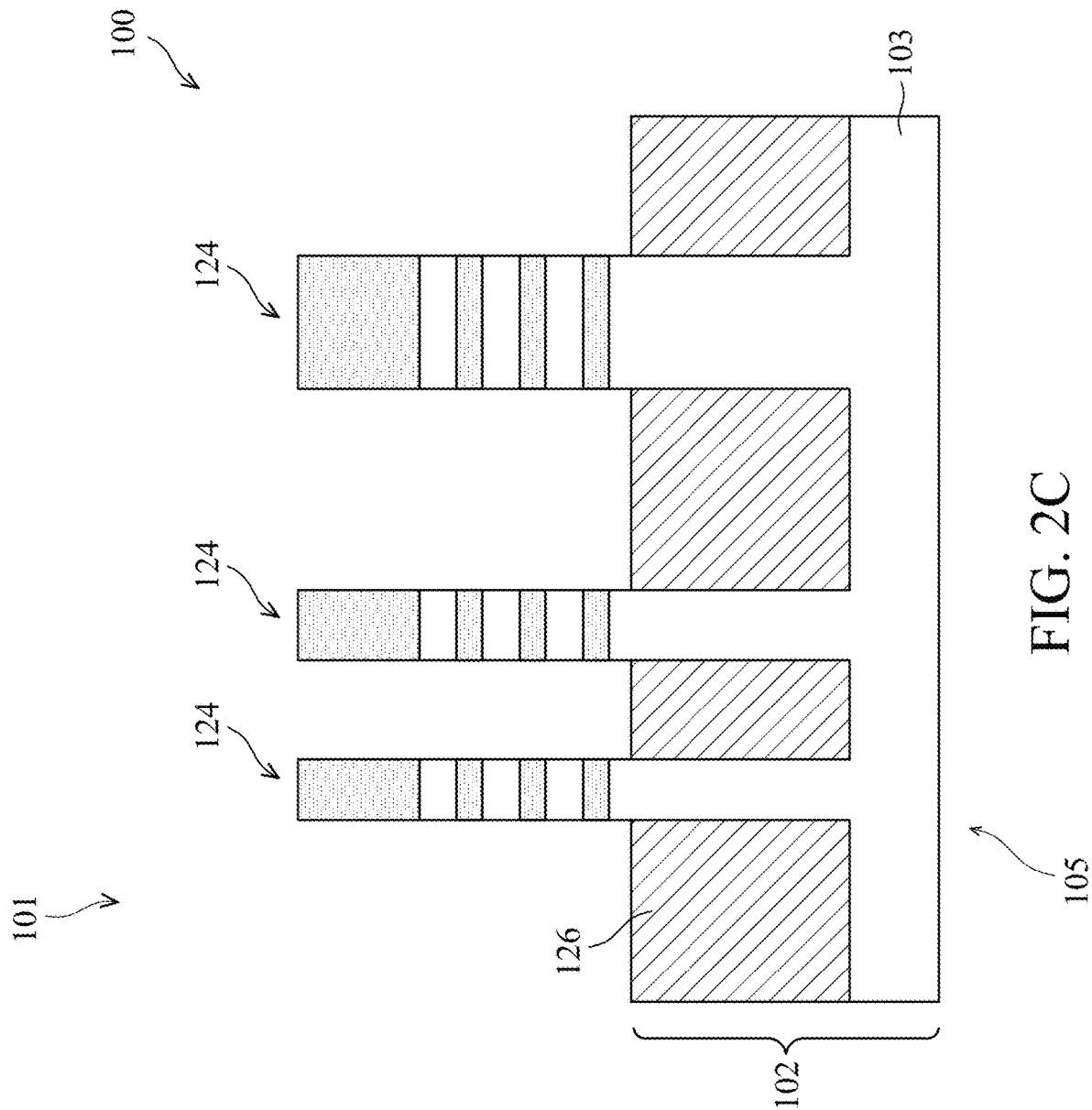

In FIG. 2C, shallow trench isolation regions have been formed in the trenches 121. The shallow trench isolation regions can be formed by depositing a dielectric material in the trenches 121 and by recessing the deposited dielectric material so that a top surface of the dielectric material is lower than the lowest sacrificial semiconductor layer 120. The hard mask 122 has been removed.

The shallow trench isolation regions 126 can be utilized to separate individual transistors or groups of transistors groups of transistors formed in conjunction with the semiconductor substrate 102. The dielectric material for the shallow trench isolation regions 126 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation regions 126 without departing from the scope of the present disclosure.

Figure 2D:
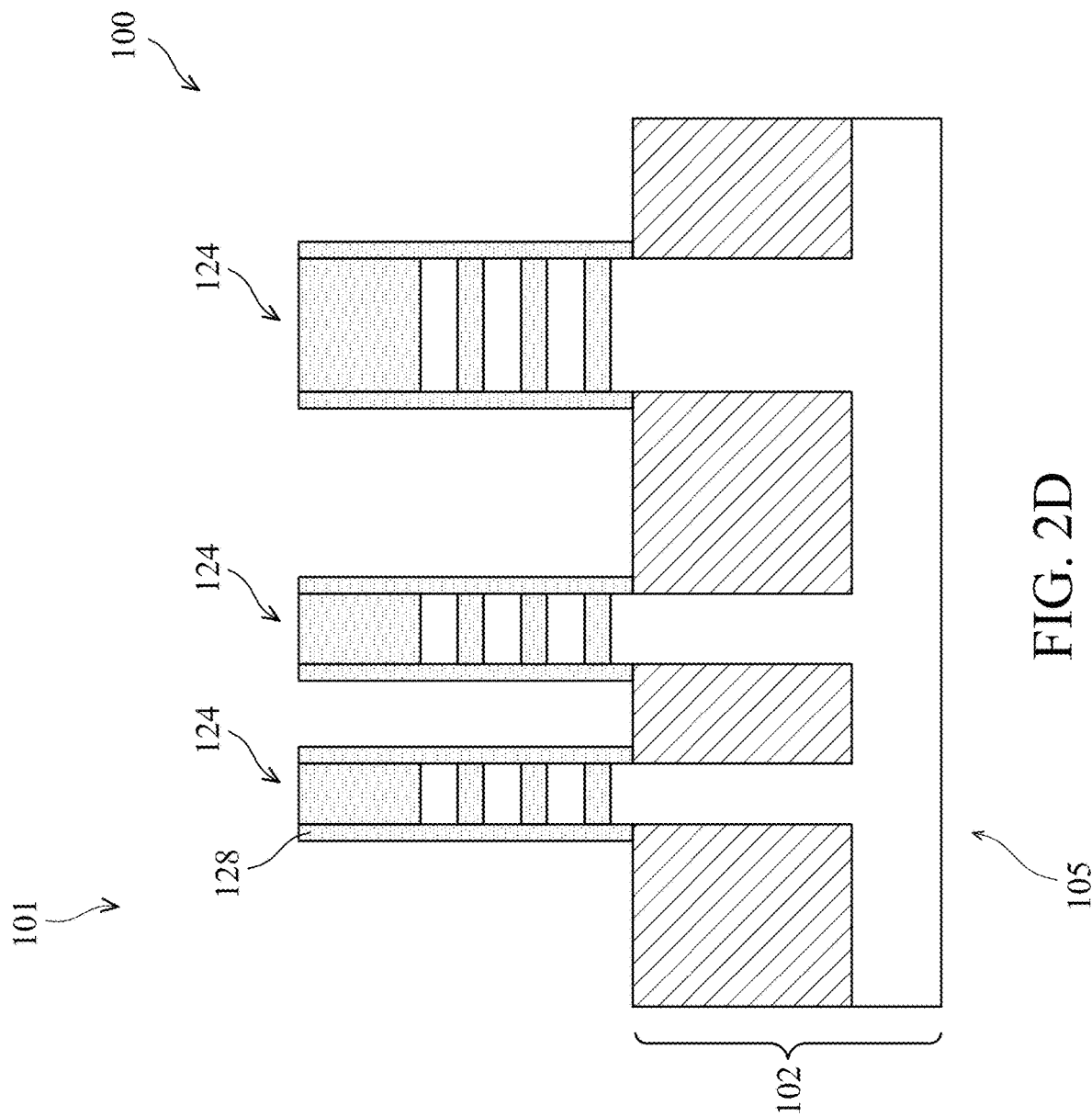

In FIG. 2D, a sacrificial semiconductor cladding 128 has been deposited on the sides of the semiconductor layers 118 and the sacrificial semiconductor layers 120. The sacrificial semiconductor cladding 128 can be formed by an epitaxial growth from the semiconductor layers 118, the sacrificial semiconductor layers 120, and the hard mask layer 122. Alternatively, the sacrificial semiconductor cladding 128 can be deposited by a chemical vapor deposition (CVD) process. Other processes can be utilized for depositing the sacrificial semiconductor cladding 128 without departing from the scope of the present disclosure.

Figure 2E:
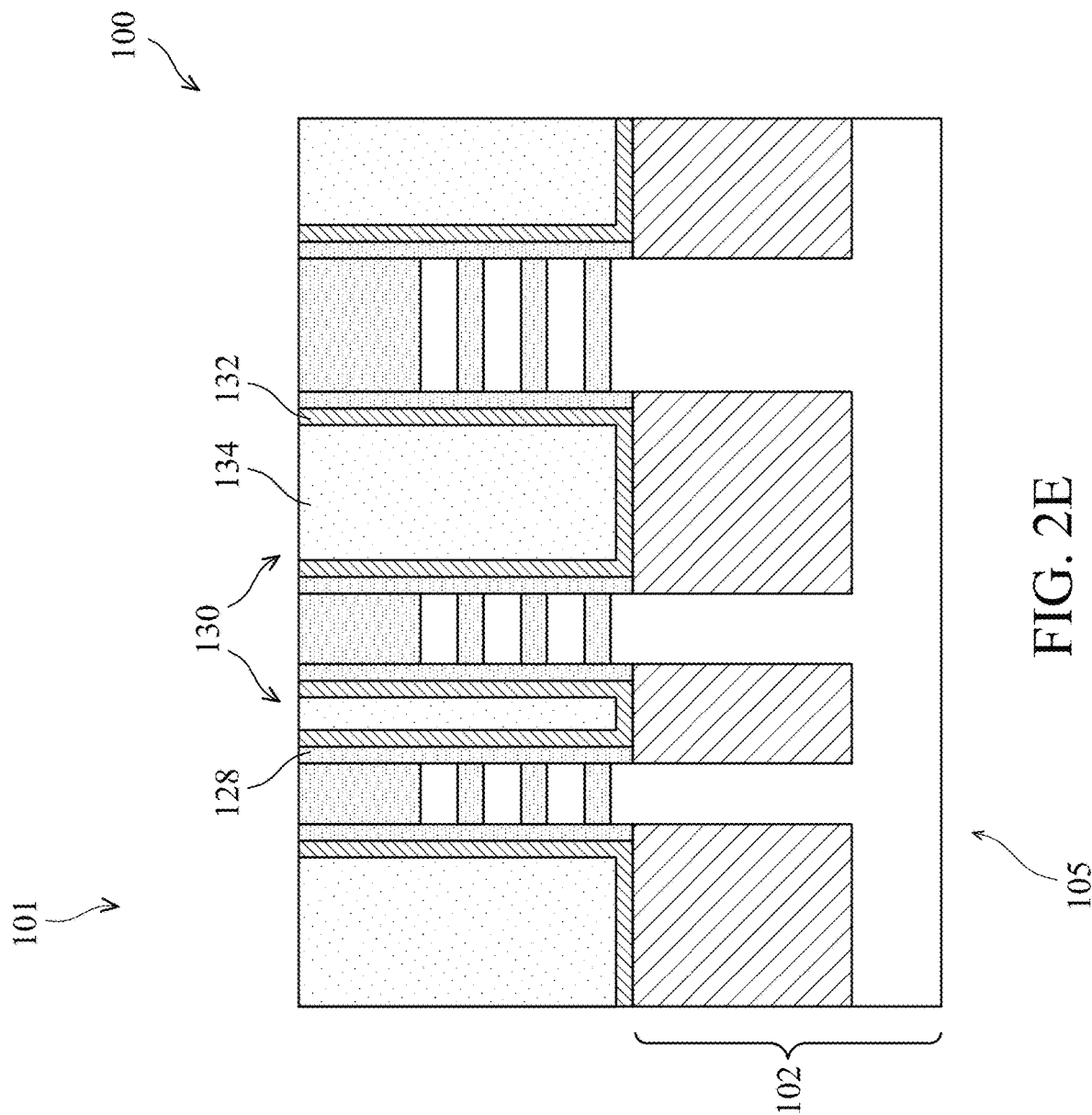

In FIG. 2E, hybrid fin structures 130 have been formed in the gaps between the sacrificial semiconductor claddings 128. The hybrid fin structures 130 include a dielectric layer 132 and a dielectric layer 134. In one embodiment, the dielectric layer 132 includes silicon nitride. In one embodiment, the dielectric layer 134 includes silicon oxide. The dielectric layer 132 can be deposited on the shallow trench isolation 126 and on the sidewalls of the sacrificial semiconductor cladding 128. The dielectric layer 134 can be deposited on the dielectric layer 132 in the trenches 121 filling the remaining space between the sacrificial semiconductor claddings 128. The dielectric layer 134 in the dielectric layer 132 can be deposited by CVD, by atomic layer deposition (ALD), or by other suitable deposition processes. After deposition of the dielectric layers 132 and 134, the hybrid fin structures 130 may be planarized by a chemical mechanical planarization (CMP) process. Other materials and deposition processes can be utilized to form the hybrid fin structures 130 without departing from the scope of the present disclosure.

Figure 2F:
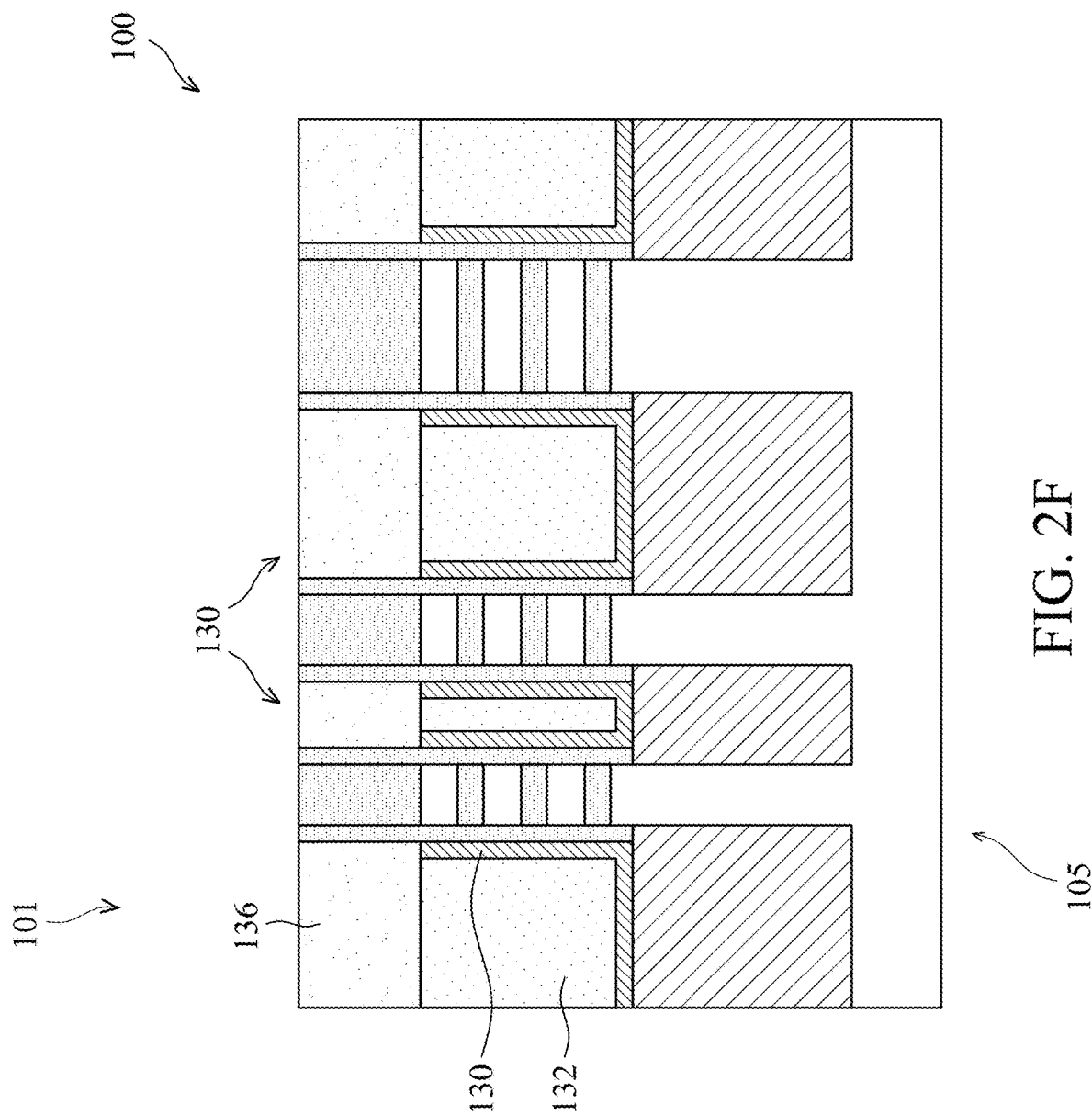

In FIG. 2F an etching process has been performed to recess the top surface of the hybrid fin structures 130. In particular, a timed etch is performed to reduce the height of the dielectric layers 132 and 134. The second etching process can include a wet etch, dry etch, or any suitable etch for recessing the hybrid fin structures 130 to a selected depth.

In FIG. 2F, a high-K dielectric layer 136 has been deposited on the dielectric layers 132 and 134. The high-K dielectric layer 136 can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 136 may be formed by CVD, ALD, or any suitable method. The planarization process, such as a CMP process, has been performed to planarize the top surface of the high-K dielectric layer 136. The high-K dielectric layer 136 is part of the hybrid fin structures 130. The high-K dielectric layer 136 may be termed a helmet layer of the hybrid fin structures 130. Other processes and materials can be utilized for the high-K dielectric layer 136 without departing from the scope of the present disclosure.

Figure 2G:
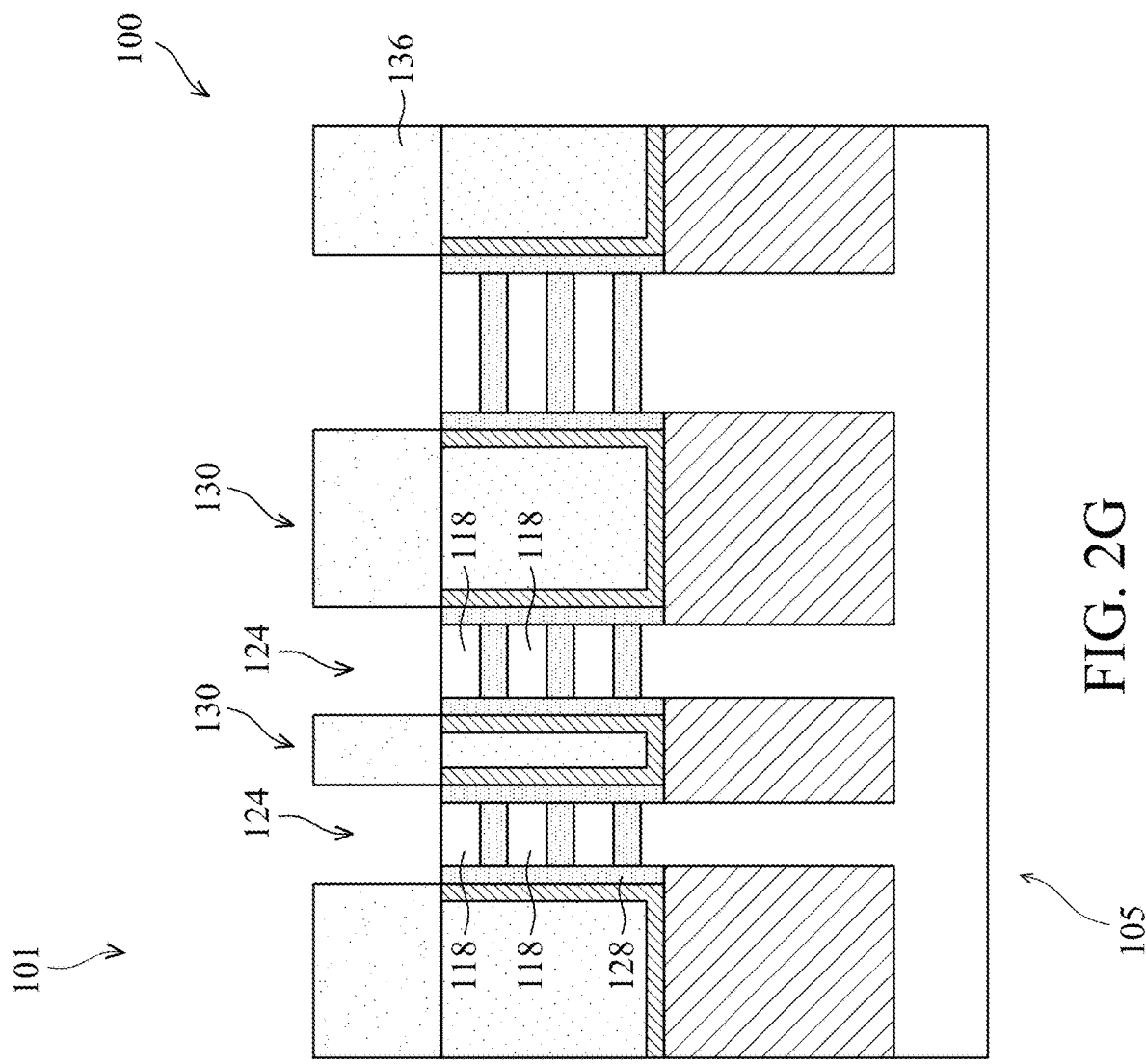

In FIG. 2G, an etching process has been performed to recess the sacrificial semiconductor cladding 128 and to remove the top sacrificial semiconductor layer 120 from each semiconductor fin 124. The etching process can be performed in one or more steps. The one or more steps selectively etch the hard mask and the materials of the sacrificial semiconductor cladding 128 and the sacrificial semiconductor layers 120 with respect to the material of the high-K dielectric layer 136. Accordingly, in FIG. 2G the high-K dielectric layer 136 remains protruding above substantially unchanged while other layers have been recessed or removed. The one or more etching steps can include wet etches, dry etches, timed etches, or other types of etching processes.

Figure 2H:
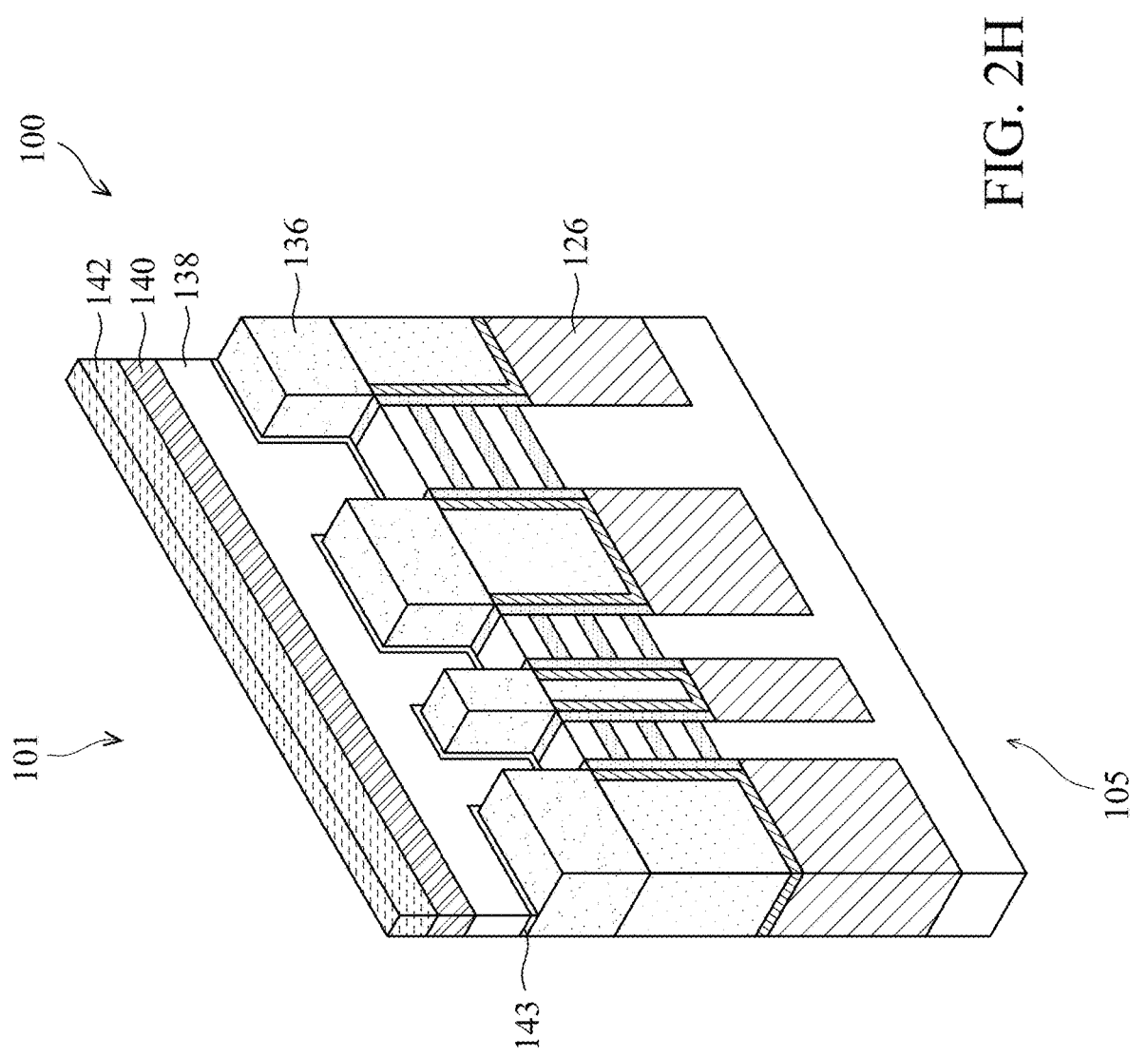

In FIG. 2H, a layer of polysilicon 138 has been deposited on the top surfaces of the sacrificial semiconductor cladding 128, the top sacrificial semiconductor layer 120, and on the high-K dielectric layer 136. The layer of polysilicon 138 can have a thickness between 20 nm and 100 nm, in some embodiments. The layer polysilicon 138 can be deposited by an epitaxial growth, a CVD process, a physical vapor deposition (PVD) process, or an ALD process. Other thicknesses and deposition processes can be used for depositing the layer polysilicon 138 without departing from the scope of the present disclosure.

In FIG. 2H, a dielectric layer 140 has been deposited on the layer of polysilicon 138. A dielectric layer 142 has been formed on the dielectric layer 140. In one example, the dielectric layer 142 includes silicon nitride. In one example, the dielectric layer 140 includes silicon oxide. The dielectric layers 140 and 142 can be deposited by CVD. The dielectric layer 140 can have a thickness between 5 nm and 15 nm. The dielectric layer 142 can have a thickness between 15 nm and 50 nm. Other thicknesses, materials, and deposition processes can be utilized for the dielectric layers 140 and 142 without departing from the scope of the present disclosure.

The dielectric layers 140 and 142 have been patterned and etched to form a hard mask for the layer of polysilicon 138. The dielectric layers 140 and 142 can be patterned and etched using standard photolithography processes. After the dielectric layers 140 and 142 have been patterned and etched to form the hard mask, the layer polysilicon 138 is etched so that only the polysilicon directly below the dielectric layers 140 and 142 remains. The polysilicon 138 and the dielectric layers 140 and 142 correspond to a dummy gate structure that will eventually be replaced with gate metals, as will be set forth in more detail below.

In one embodiment, a thin dielectric layer 143 can be deposited prior to deposition of the layer of polysilicon 138. The thin dielectric layer 143 can be between 1 nm and 5 nm in thickness. The thin dielectric layer 143 can include silicon oxide. Other materials, deposition processes, and thicknesses can be utilized for the thin dielectric layer 143 without departing from the scope of the present disclosure.

Figure 2I:
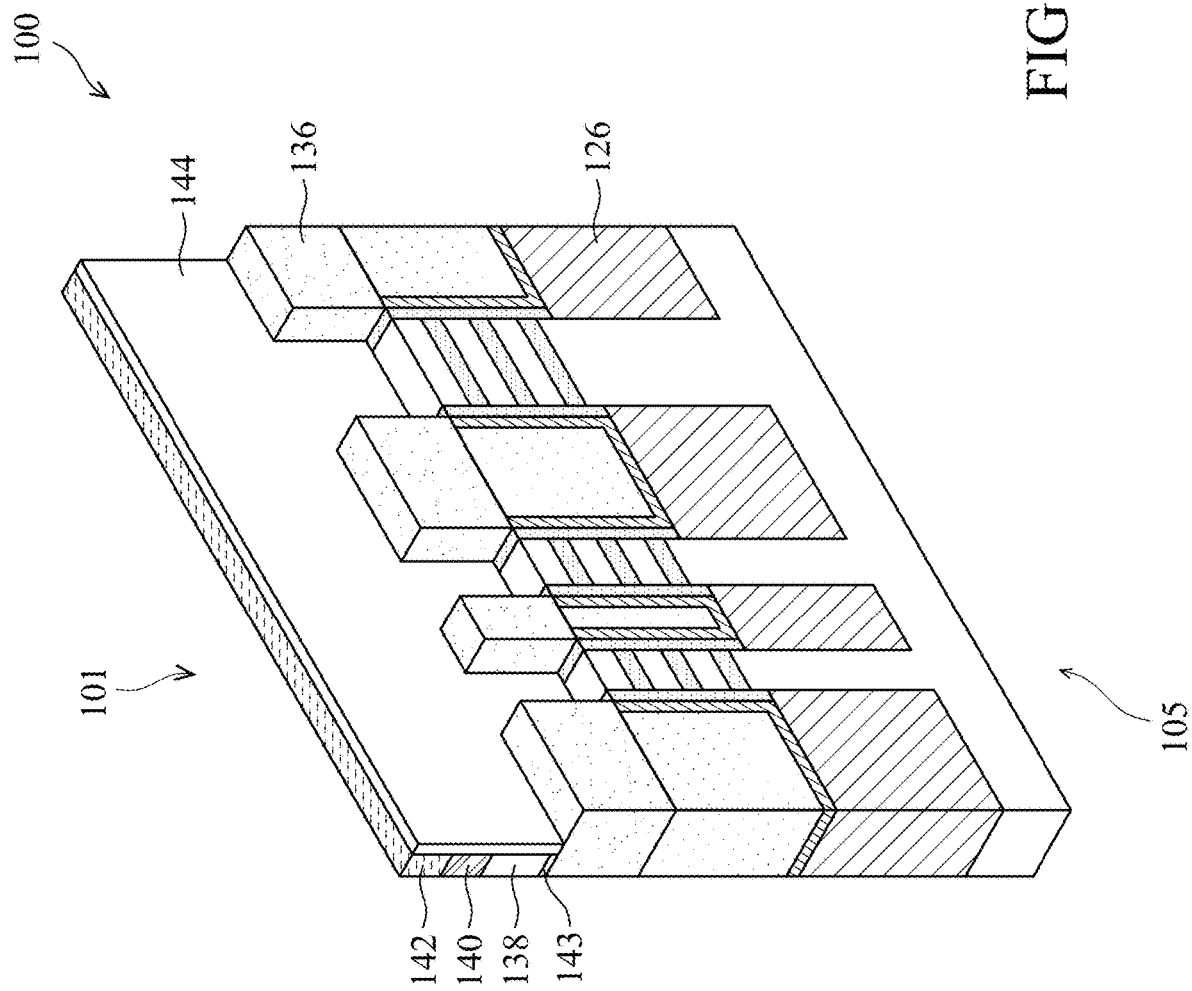

In FIG. 2I, a gate spacer layer 144 has been deposited on the exposed top surfaces of the sacrificial semiconductor cladding 128 and the top sacrificial semiconductor layer 120, as well as on the sidewalls of the layer of polysilicon 138 and the dielectric layers 140 and 142. In one example, the gate spacer layer 144 includes SiCON. The gate spacer layer 144 can be deposited by CVD, PVD, or ALD. Other materials and deposition processes can be utilized for the gate spacer layer 144 without departing from the scope of the present disclosure.

The gate spacer layer 144 acts as a mask for etching portions of the sacrificial semiconductor cladding 128, the semiconductor layers 118, and the sacrificial semiconductor layers 120 in preparation for depositing source and drain regions as will be set forth in further detail below.

Figure 2J:
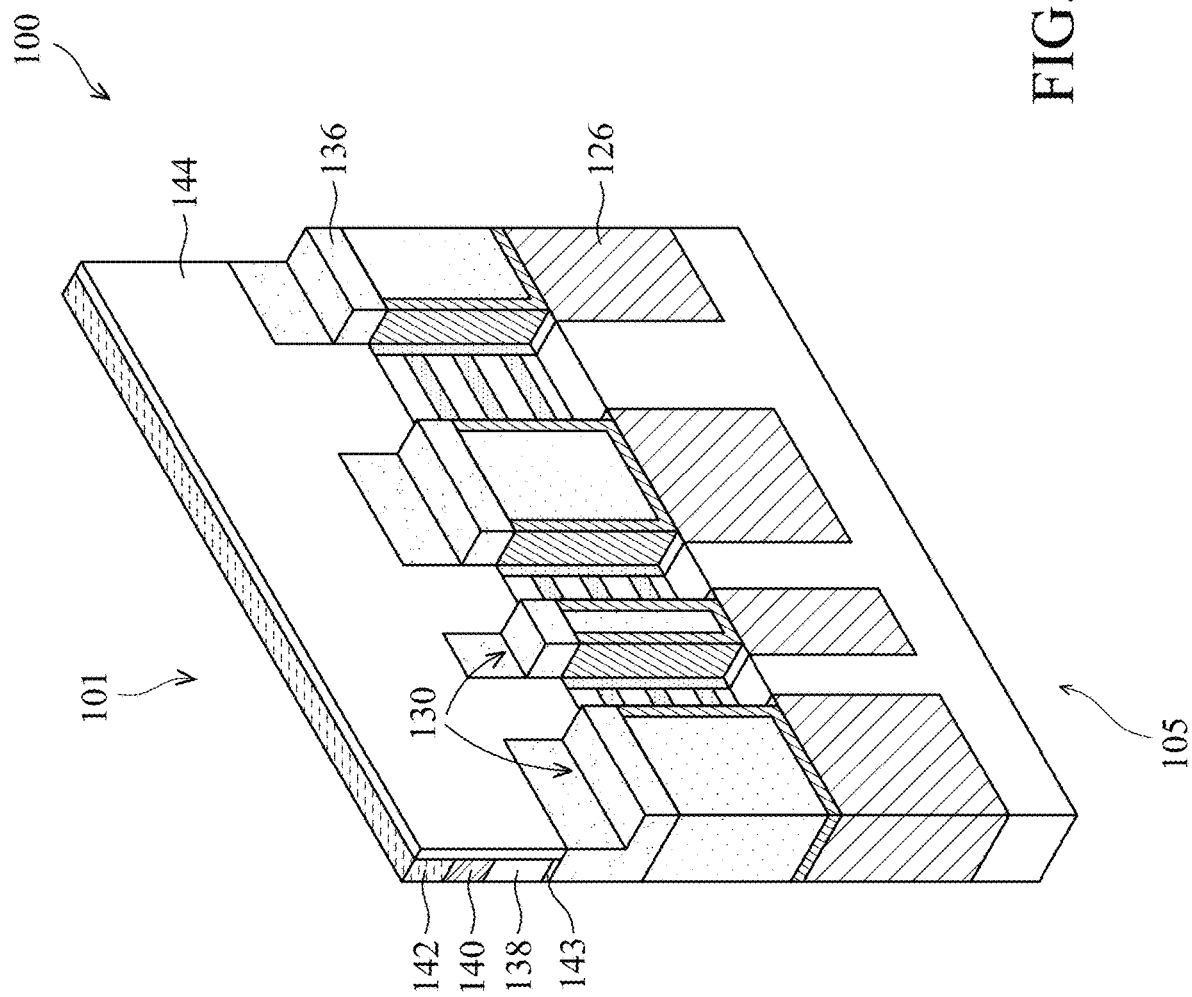

In FIG. 2J, an anisotropic etching process is performed that selectively etches in the downward direction. The portions of the sacrificial semiconductor cladding 128, the semiconductor layers 118, and the sacrificial semiconductor layers 120 that are not directly below the gate spacer layer 144 and the polysilicon 138 are etched. The result is that a portion of the shallow trench isolation regions 126 and the substrate 102 are exposed.

The high-K dielectric layer 136 is etched at a comparatively slow rate with respect to the various semiconductor layers. The result is that only about half of the exposed high-K dielectric layer 136 is etched. Accordingly, the dielectric layers 132 and 134 below the high-K dielectric 136 are not substantially etched during the etching process.

Figure 2K:
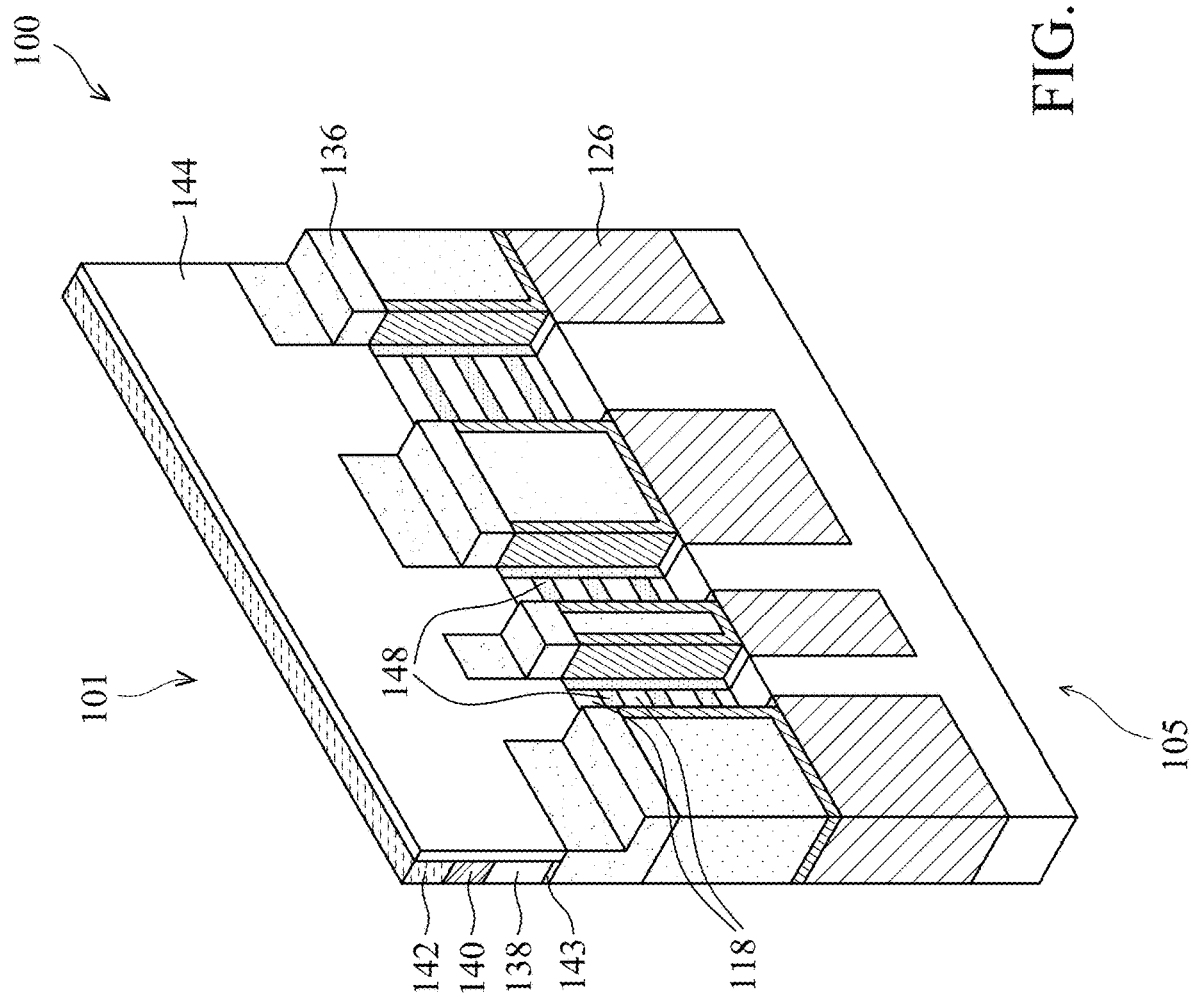

In FIG. 2K, an etching process has been performed to recess the sacrificial semiconductor cladding 128 and the sacrificial semiconductor layers 120 with respect to the semiconductor layers 118. The etching process can be performed by a chemical bath that selectively etches the sacrificial semiconductor cladding 128 and sacrificial semiconductor nanostructures 120 with respect to the semiconductor layers 118.

In FIG. 2K, an inner spacer layer 148 has been deposited between the semiconductor layers 118 in the recesses formed by partial removal of the sacrificial semiconductor layers 120. The inner spacer layer 148 has also been formed in the recesses formed by partial removal of the sacrificial semiconductor cladding 128. The inner spacer layer 148 can be deposited by an ALD process, a CVD process, or other suitable processes. In one example, the inner spacer layer 148 includes silicon nitride. After deposition of the inner spacer layer 148, an etching process is performed utilizing the gate spacer layer 144 as a mask. The etching process removes the inner spacer layer 148 except directly below the gate spacer layer 144.

Figure 2L:
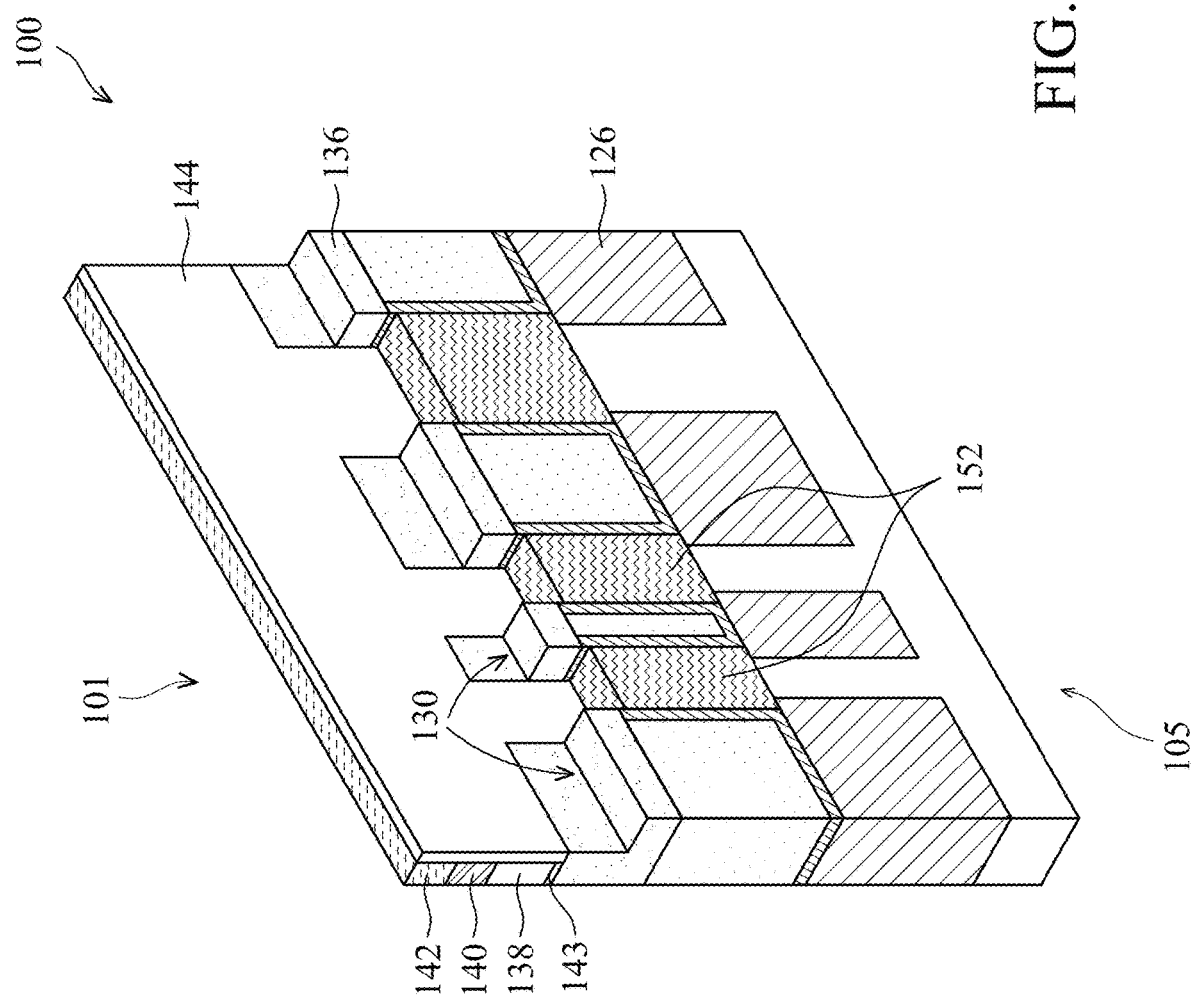

In FIG. 2L, source/drain regions 152 have been formed. The source/drain regions 152 includes semiconductor material. The source/drain regions 152 can be grown epitaxially from the semiconductor layers 118. The source/drain regions 152 can be epitaxially grown from the semiconductor layers 118 or from the substrate 102. The source/drain regions 152 can be doped with N-type dopants species in the case of N-type transistors. The source/drain regions 152 can be doped with P-type dopant species in the case of P-type transistors. The doping can be performed in-situ during the epitaxial growth. The hybrid fin structures 130 can act as electrical isolation between the source/drain regions 152 of adjacent transistors.

Figure 2M:
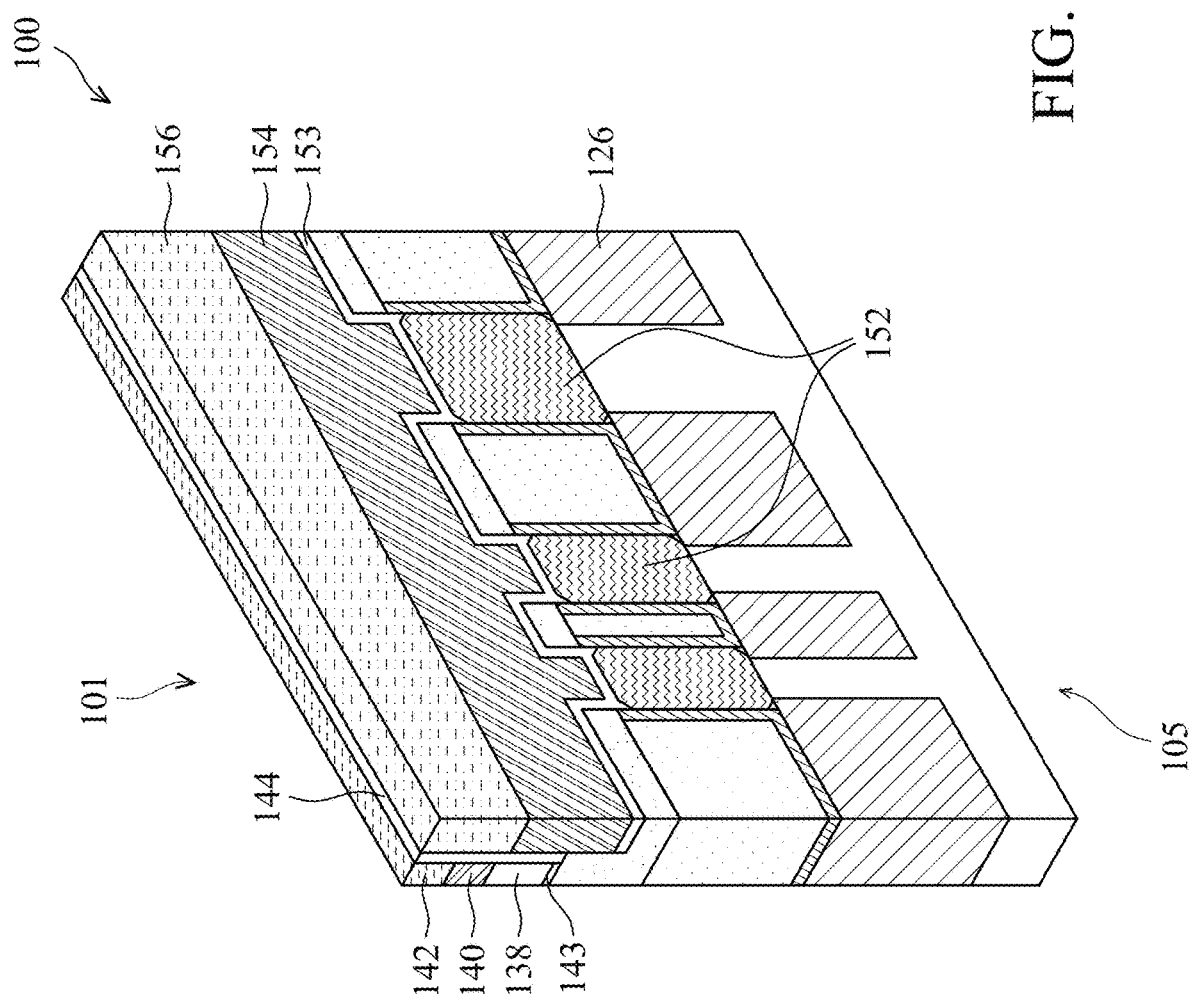

In FIG. 2M, a dielectric layer 153 has been deposited on the source/drain regions 152 and on the high-K dielectric layer 136. The dielectric layer 153 can include silicon nitride or SiCON. The dielectric layer 153 can be deposited by CVD, ALD, or other suitable processes. An interlevel dielectric layer 154 has been deposited on the dielectric layer 153. The interlevel dielectric layer 154 can include silicon oxide. The interlevel dielectric layer 154 can be deposited by CVD, ALD, or other suitable processes. A dielectric layer 156 has been deposited on the dielectric layer 154, can include silicon nitride, and can be deposited by ALD, CVD, or PVD. Other materials and processes can be utilized for the dielectric layers 153, 154, and 156 without departing from the scope of the present disclosure.

Figure 2N:
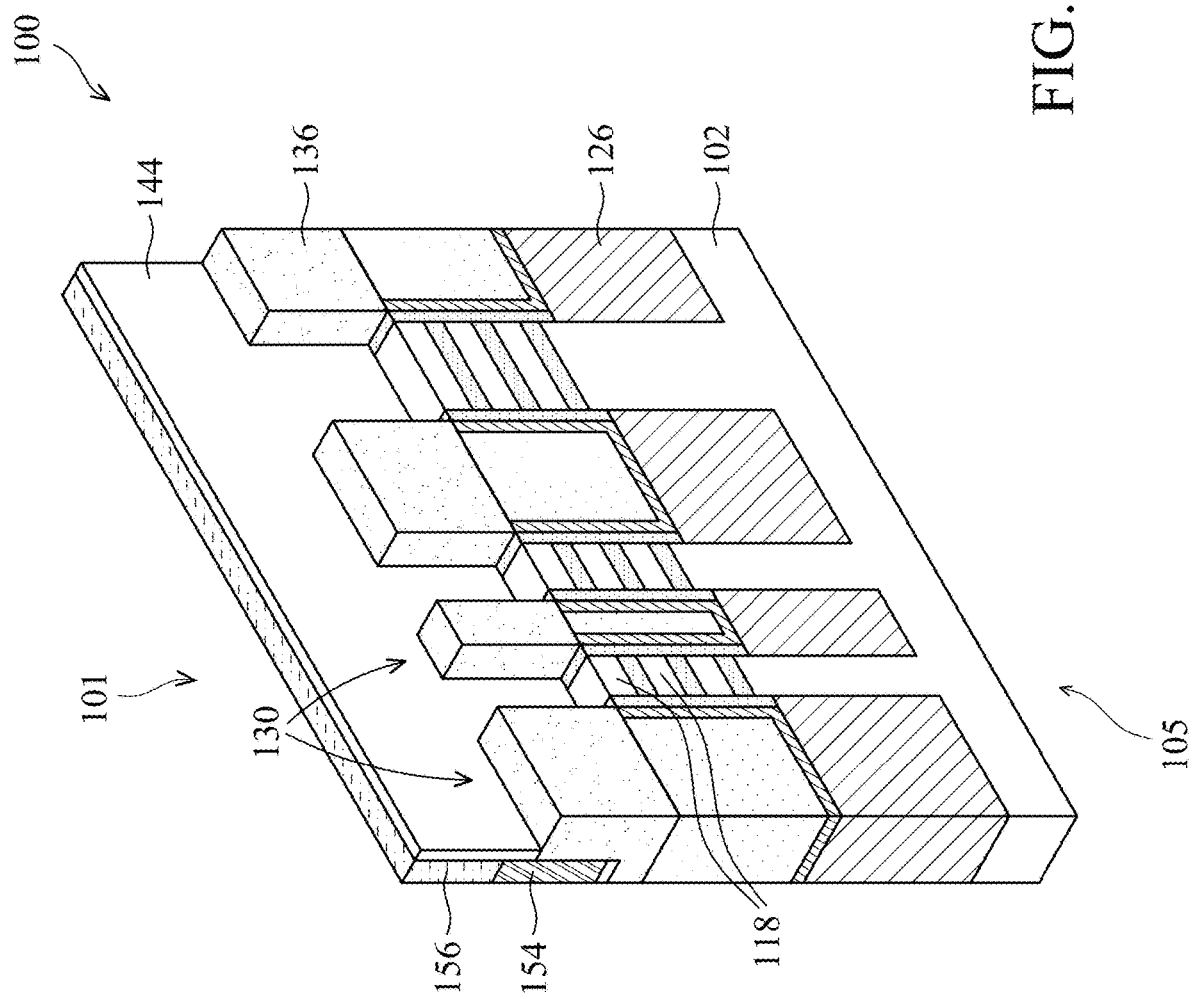

In FIG. 2N, the view has been shifted from FIG. 2M so that the source/drain regions 152 are in the foreground and are no longer visible. The polysilicon 138 and the dielectric layers 140 and 142 have been removed by one or more etching processes. Put another way, the cross-section of FIG. 2N is taken between the gate spacers 144 of the dummy gate structures of which the high-K dielectric layer 136 is part and of which the polysilicon 138 and the dielectric layer 140 were previously part. The sacrificial semiconductor layers 120 and the sacrificial semiconductor cladding 128 are visible in the view of FIG. 2N because they were not entirely removed in FIG. 2K, but were merely recessed.

Figure 2O:
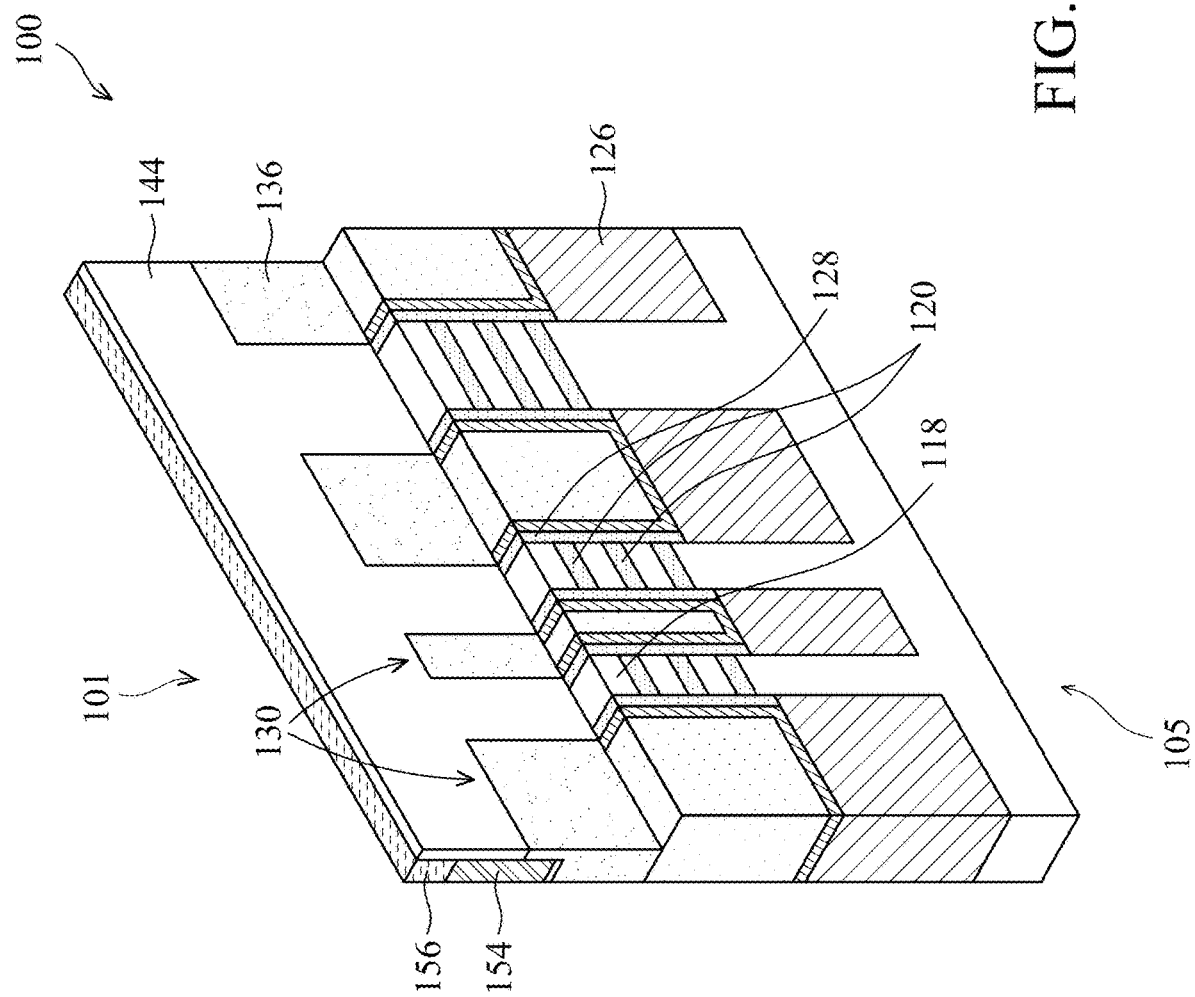

In FIG. 2O, the remainder of the dummy gate structure has been removed. This corresponds to removal of the high-K dielectric layer 136 from above the fins 124. The high-K dielectric layer 136 can be removed from above the fins 124 via one or more etching process including wet etches, dry etches, or other types of etching processes.

The structure shown in FIG. 2O may be further processed as shown in FIGS. 3A through 3L. In FIGS. 3A through 3L, the semiconductor device structure of the integrated circuit 100 is illustrated in a perspective view. While certain details of the structure formed as described with respect to FIGS. 2A to 2O may not be illustrated in FIGS. 3A to 3L, it will be readily appreciated that such details may be included in various embodiments.

Figure 3A:
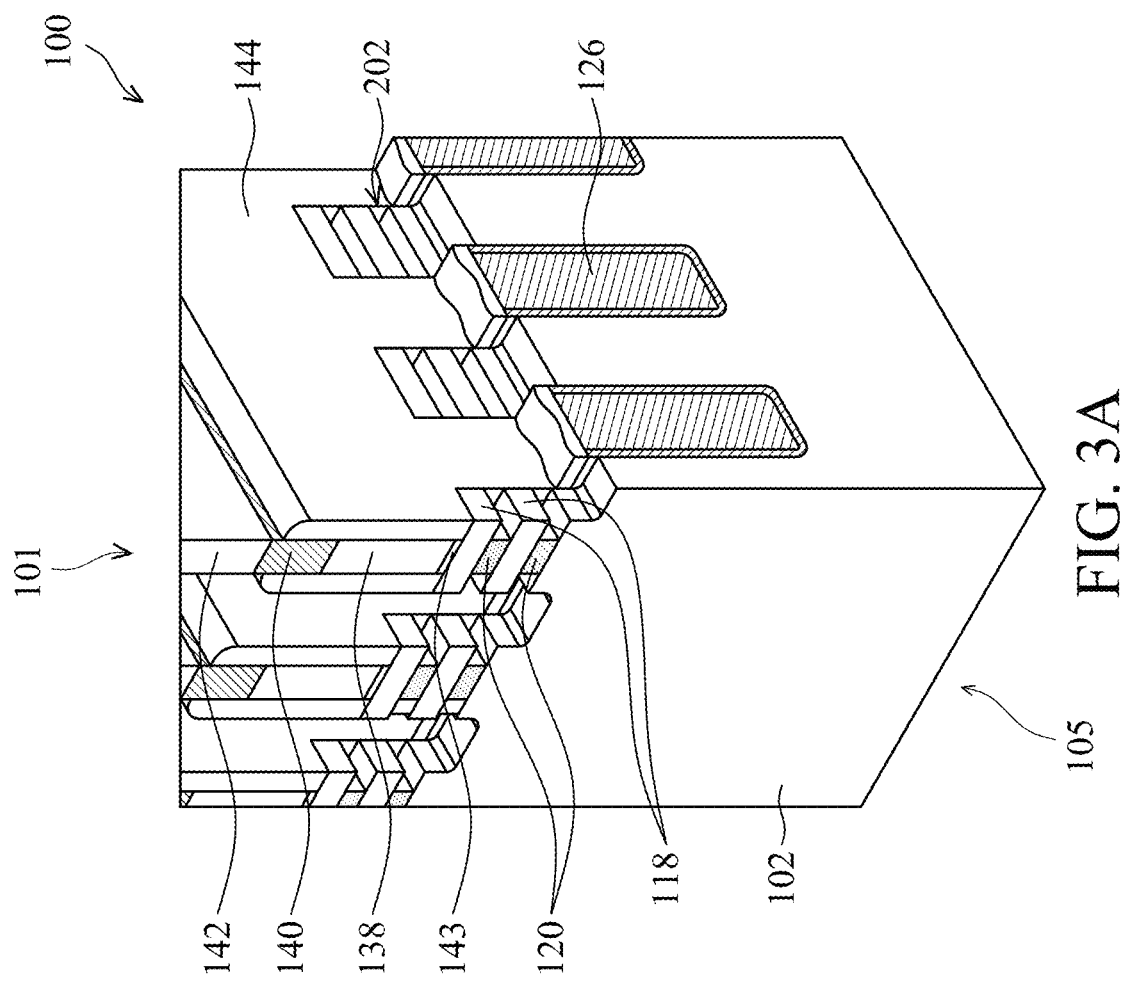

As shown in FIG. 3A, the sacrificial semiconductor cladding 128 is removed and the sacrificial semiconductor layers 120 are at least partially removed. In some embodiments, the sacrificial semiconductor layers 120 are or include silicon germanium (SiGe). The sacrificial semiconductor layers 120 may be laterally recessed, leaving generally horizontal strips of the sacrificial semiconductor layers 120 between adjacent nanosheets or semiconductor layers 118. Recessed regions 202 extend inwardly from outer edges of the semiconductor layers 118.

In some embodiments, the sacrificial semiconductor cladding 128 and portions of the sacrificial semiconductor layers 120 may be removed with an etching process that selectively etches the sacrificial semiconductor layers 120 and cladding 128 with respect to the material of the semiconductor layers 118.

Figure 3B:
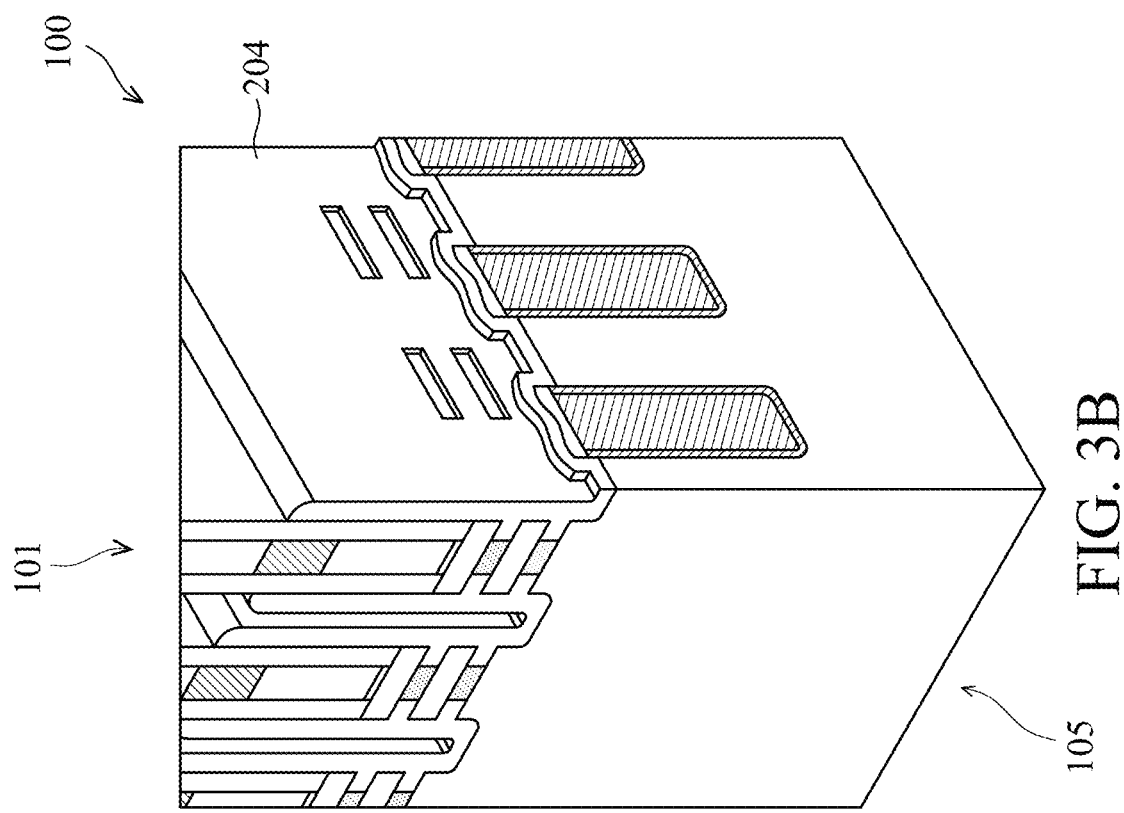

As shown in FIG. 3B, a dielectric layer 204 is formed on sidewalls of the gate spacers 144, on side surfaces of the semiconductor layers 118, and in the recesses 202. For example, in some embodiments, the dielectric layer 204 may contact side surfaces of the recessed sacrificial semiconductor layers 120.

The dielectric layer 204 may be formed by any suitable technique, and in some embodiments, the dielectric layer 204 is formed by deposition. The dielectric layer 204 can include silicon nitride or SiCON. The dielectric layer 204 can be deposited by CVD, ALD, or other suitable processes. Other materials and processes can be utilized for the dielectric layer 204 without departing from the scope of the present disclosure.

Figure 3C:
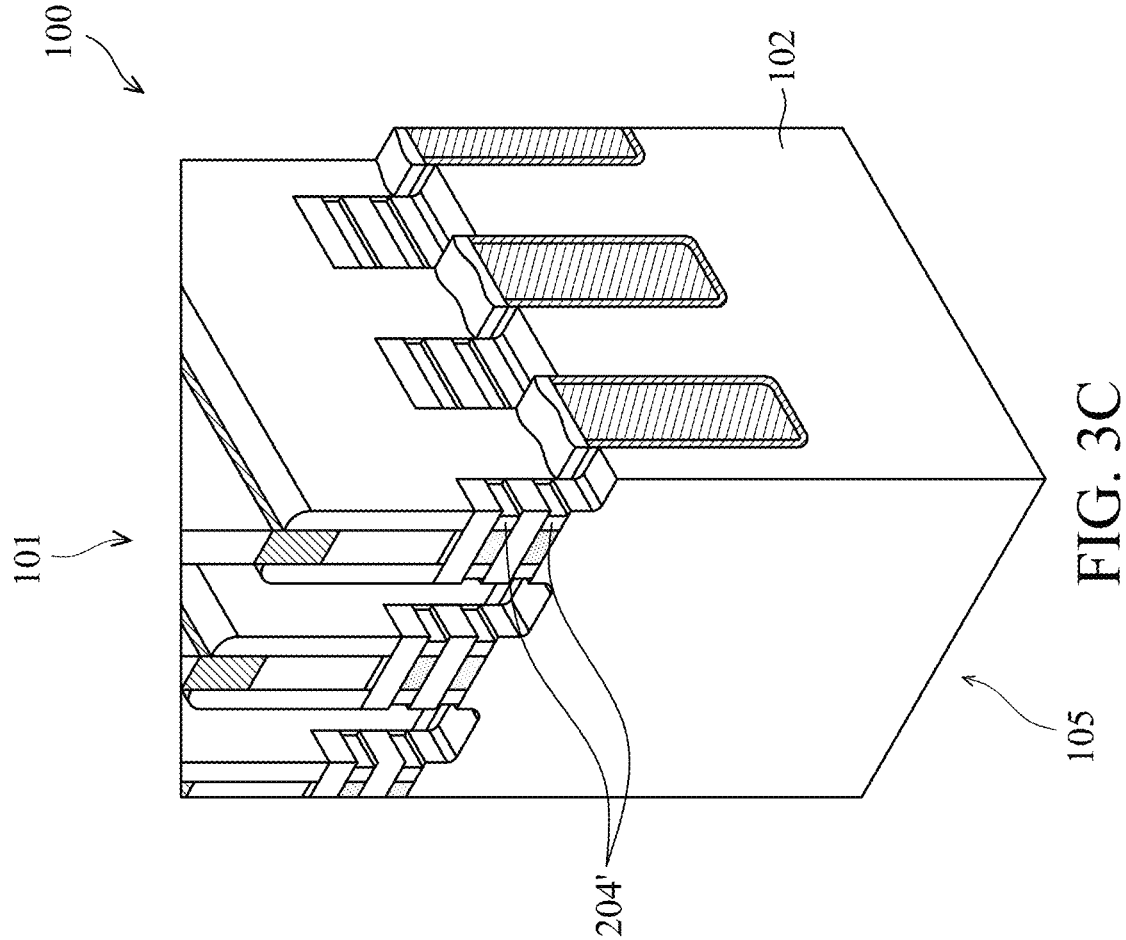

As shown in FIG. 3C, the dielectric layer 204 is removed from the sidewalls of the gate spacers 144 and from the side surfaces of the semiconductor layers 118, while portions 204' of the dielectric layer 204 remain in the recesses 202. The dielectric layer 204 may be removed by any suitable technique, such as by an etching process which may selectively etch the dielectric layer 204.

Figure 3D:
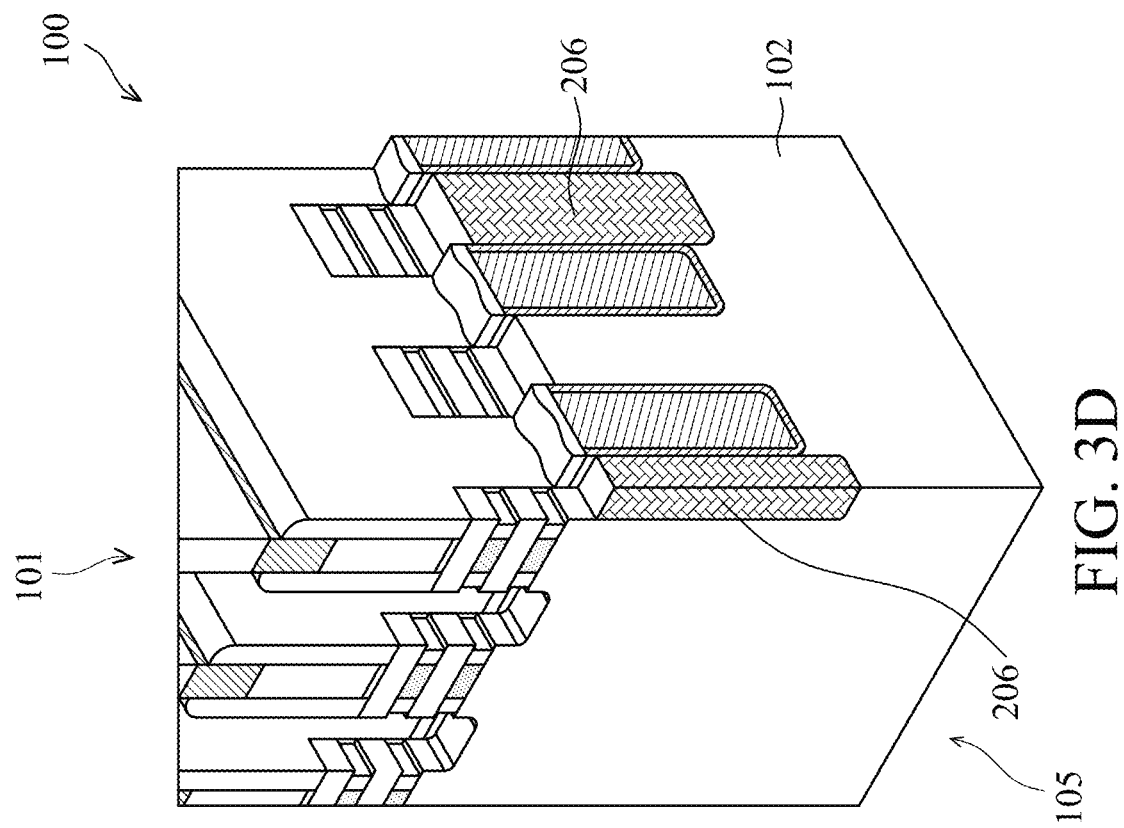

As shown in FIG. 3D, semiconductor regions 206 are formed in the substrate 102. The semiconductor regions 206 may be formed by any suitable technique. In some embodiments, recesses are formed by removing portions of the substrate 102, for example, by etching, and the semiconductor regions 206 are formed in the recesses. In some embodiments, the semiconductor regions 206 may be epitaxially grown in the recesses. In some embodiments, the semiconductor regions 206 are formed of or include SiGe. In some embodiments, the semiconductor regions 206 are formed of a different material composition than that of the substrate 102. For example, the substrate 102 may be a Si substrate, and the semiconductor regions 206 may be formed of SiGe.

The semiconductor regions 206 may be formed directly adjacent to one or more of the shallow trench isolation regions 126, as shown in FIG. 3D. In some embodiments, the semiconductor regions 206 may be formed to contact the shallow trench isolation regions 126.

Figure 3E:
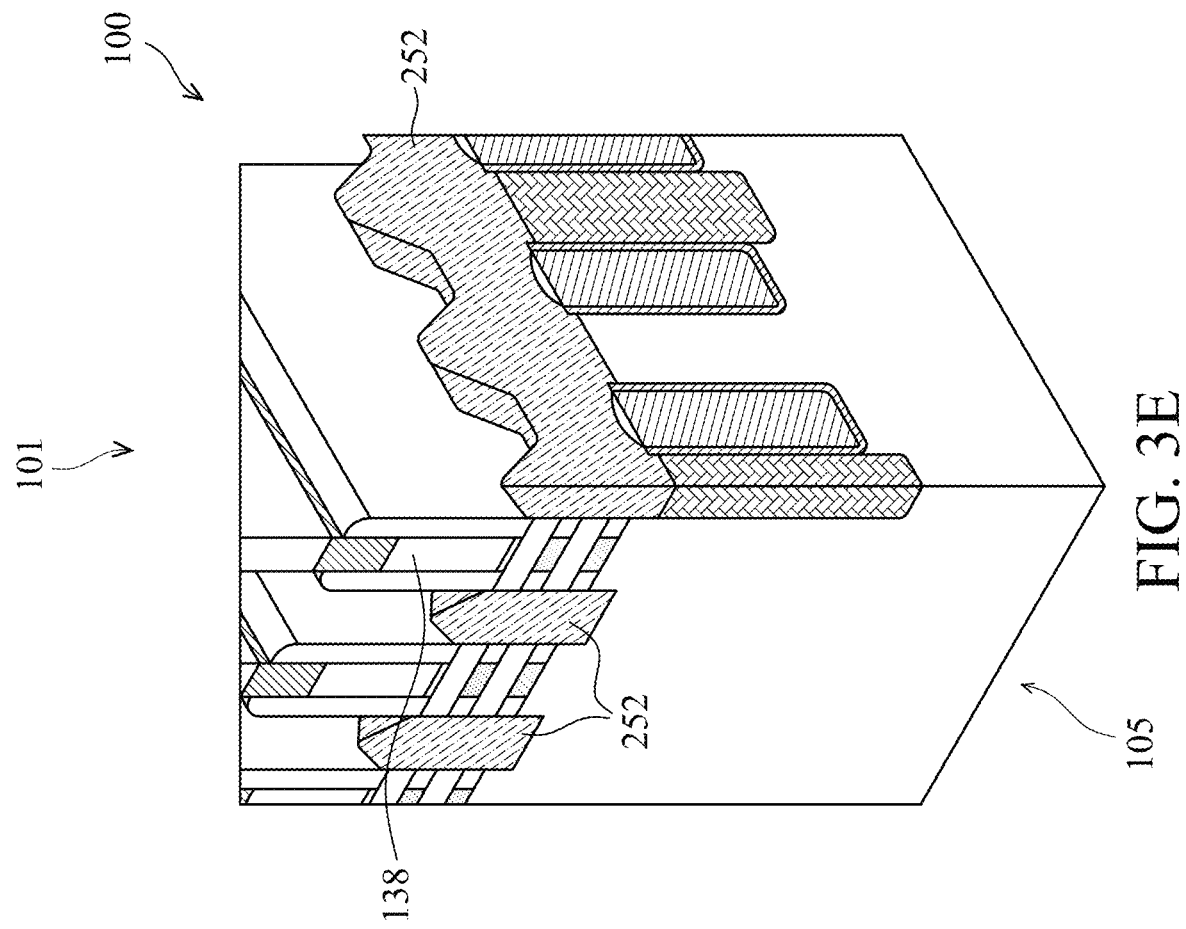

As shown in FIG. 3E, source/drain regions 252 are formed. In some embodiments, the source/drain regions 252 may be formed instead of the source/drain regions 152 as previously described, for example, with respect to FIGS. 2L and 2M. That is, at least some of the features and processes described with FIGS. 2L and 2M may be replaced, in some embodiments, with the process described with respect to FIG. 3E. The source/drain regions 252 include semiconductor material. In some embodiments, the source/drain regions 252 may be grown epitaxially, e.g., from the semiconductor layers 118, the substrate 102, or the semiconductor regions 206. The source/drain regions 252 can be doped with N-type dopants species in the case of N-type transistors. The source/drain regions 252 can be doped with P-type dopant species in the case of P-type transistors. The doping can be performed in-situ during the epitaxial growth.

Figure 3F:
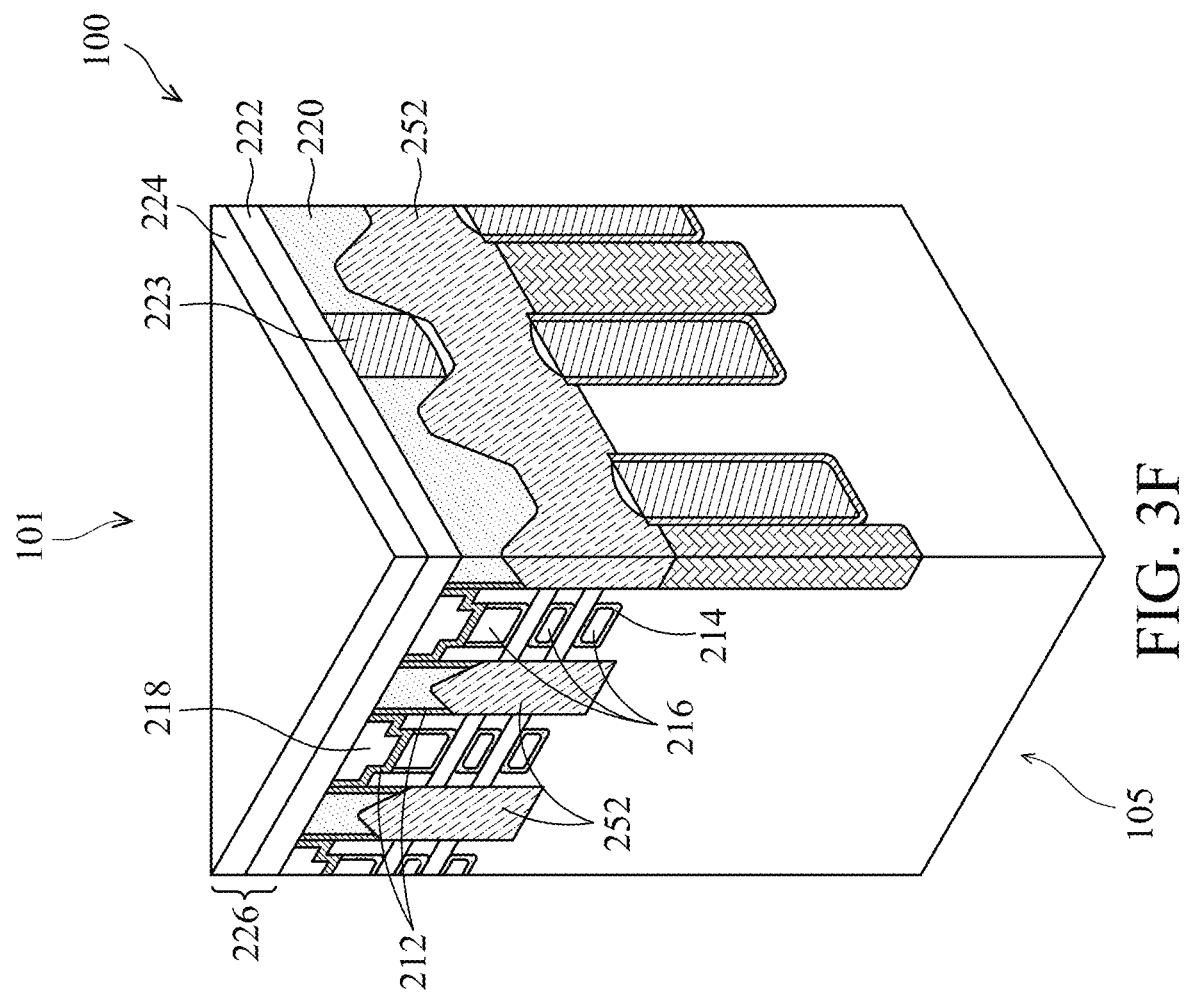

As shown in FIG. 3F, portions of the gate spacers 144 are removed, as well as corresponding materials disposed between the gate spacers 144. In some embodiments, a dielectric liner 212 is formed, e.g. grown, on the sides of the gate spacers 144 and on top surfaces of the source/drain regions 252. The dielectric liner 212 can include silicon nitride, in some embodiments, or another suitable material.

In some embodiments, the portions of the gate spacers 144 are removed by a cutting process. In some embodiments, the cutting process exposes the polysilicon 138. The cutting process can include one or more of a dry etching process, a wet etching process, and a chemical mechanical planarization (CMP) process.

In FIG. 3F, the remainder of the polysilicon 138 and the dielectric layers 140 and 142 corresponding to the dummy gate structure have been removed. The sacrificial semiconductor layers 120 have been removed. The sacrificial semiconductor layers 120 can be removed with an etching process that selectively etches the sacrificial semiconductor layers 120 with respect to the material of the semiconductor layers 118. After the etching process, the semiconductor layers 118 are no longer covered by sacrificial semiconductor structures.

As shown in FIG. 3F, a gate dielectric 214 is deposited on the exposed surfaces of the semiconductor layers 118. The gate dielectric 214 is shown as only a single layer. However, in practice, the gate dielectric 214 may include multiple dielectric layers. For example, the gate dielectric 214 may include an interfacial dielectric layer that is in direct contact with the semiconductor layers 118. The gate dielectric 214 may include a high-K gate dielectric layer positioned on the interfacial dielectric layer. Together, the interfacial dielectric layer and the high-K gate dielectric layer form a gate dielectric 214 for the transistors of the integrated circuit 100.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The interfacial dielectric layer can be formed by a thermal oxidation process, a chemical vapor deposition (CVD) process, or an atomic layer deposition (ALD) process. In some embodiments, the interfacial dielectric layer can have a thickness between 0.5 nm and 2 nm. Other materials, deposition processes, and thicknesses can be utilized for the interfacial dielectric layer without departing from the scope of the present disclosure.

The high-K gate dielectric layer and the interfacial dielectric layer physically separate the semiconductor layers 118 from the gate metals that will be deposited in subsequent steps. The high-K gate dielectric layer and the interfacial dielectric layer isolate the gate metals from the semiconductor layers 118 that correspond to the channel regions of the transistors.

The high-K gate dielectric layer includes one or more layers of a dielectric material, such as $HfO_2$, HfSiO, HfSION, HfTaO, HfTIO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. In one embodiment, the high-K gate dielectric layer is formed using a highly conformal deposition process such as ALD in order to ensure the formation of a gate dielectric layer having a uniform thickness around each semiconductor layer 118. In one embodiment, the thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes $HfO_2$ with dipole doping including La and Mg, and a second layer including a higher-K ZrO layer with crystallization.

After formation of the gate dielectric 214, e.g., by deposition, a gate metal is deposited. The gate metal forms a gate electrode 216 around the semiconductor nanostructures or layers 118. The gate metal is in contact with the gate dielectric 214. The gate metal is positioned between semiconductor layers 118. In other words, the gate metal is positioned all around the semiconductor nanostructures or layers 118. For this reason, the transistors of the integrated circuit 100, e.g., the first transistor 104, formed in relation to the semiconductor nanostructures 118 are called gate all around transistors.

Although the gate electrodes 216 are each shown as a single metal layer, in practice, the gate electrodes 216 may each include multiple metal layers. For example, the gate electrodes 216 may include one or more very thin work function layers in contact with the gate dielectric 214. The thin work function layers can include titanium nitride, tantalum nitride, or other conductive materials suitable for providing a selected work function for the transistors. The gate electrodes 216 can further include a gate fill material that corresponds to the majority of the gate electrodes 216. The gate fill material can include cobalt, tungsten, aluminum, or other suitable conductive materials. The layers of the gate electrodes 216 can be deposited by PVD, ALD, CVD, or other suitable deposition processes. In some embodiments, the gate electrodes 216 are formed of one or more of titanium (Ti), titanium nitride (TiN), or tungsten (W), and in some embodiments, the gate electrodes 216 may include one or more dopant materials, such as lanthanum (La), zirconium (Zr), or hafnium (Hf).

In some embodiments, the dielectric liner layer 212 is formed on the exposed top portions of the gate electrodes 216. A dielectric cap layer 218 is formed on the dielectric liner layer 212. The dielectric cap layer 218 may include silicon oxide or other suitable dielectric materials.

In some embodiments, a silicide layer may be formed on the top surfaces of the source/drain regions 252. The silicide layer may include titanium silicide, aluminum silicide, nickel silicide, tungsten silicide, or other suitable silicides.

As shown in FIG. 3F, source/drain contacts 220 are formed on the on the source/drain regions 252, and in some embodiments, may be formed on any silicide layer which may be present on the source/drain regions 252. The source/drain contacts 220 can include a conductive material such as tungsten, titanium, aluminum, tantalum, or other suitable conductive materials.

Dielectric breaks 223 may be inserted into the source/drain contacts 220 selectively in order to isolate some transistors from others. The dielectric breaks can include silicon oxide, silicon nitride, or other dielectric materials.

In some embodiments, first and second dielectric layers 222, 224 of a dielectric structure 226 are formed to cover the exposed upper structures of the device. For example, the first dielectric layer 222 may be formed on the upper surfaces of the dielectric liner 212, the dielectric cap layer 218, the source/drain contacts 220, and the dielectric breaks 223. The first dielectric layer 222 of the dielectric structure 226 can include silicon nitride, in some embodiments, or another suitable material. In some embodiments, the first dielectric layer 222 of the dielectric structure 226 may be formed of a same material as the dielectric liner 212.

The second dielectric layer 224 of the dielectric structure 226 is formed on the first dielectric layer 222. The second dielectric layer 224 of the dielectric structure 226 can include silicon nitride, in some embodiments, or another suitable material. In some embodiments, the second dielectric layer 224 of the dielectric structure 226 may be formed of a different dielectric material than the first dielectric layer 222.

Figure 3G:
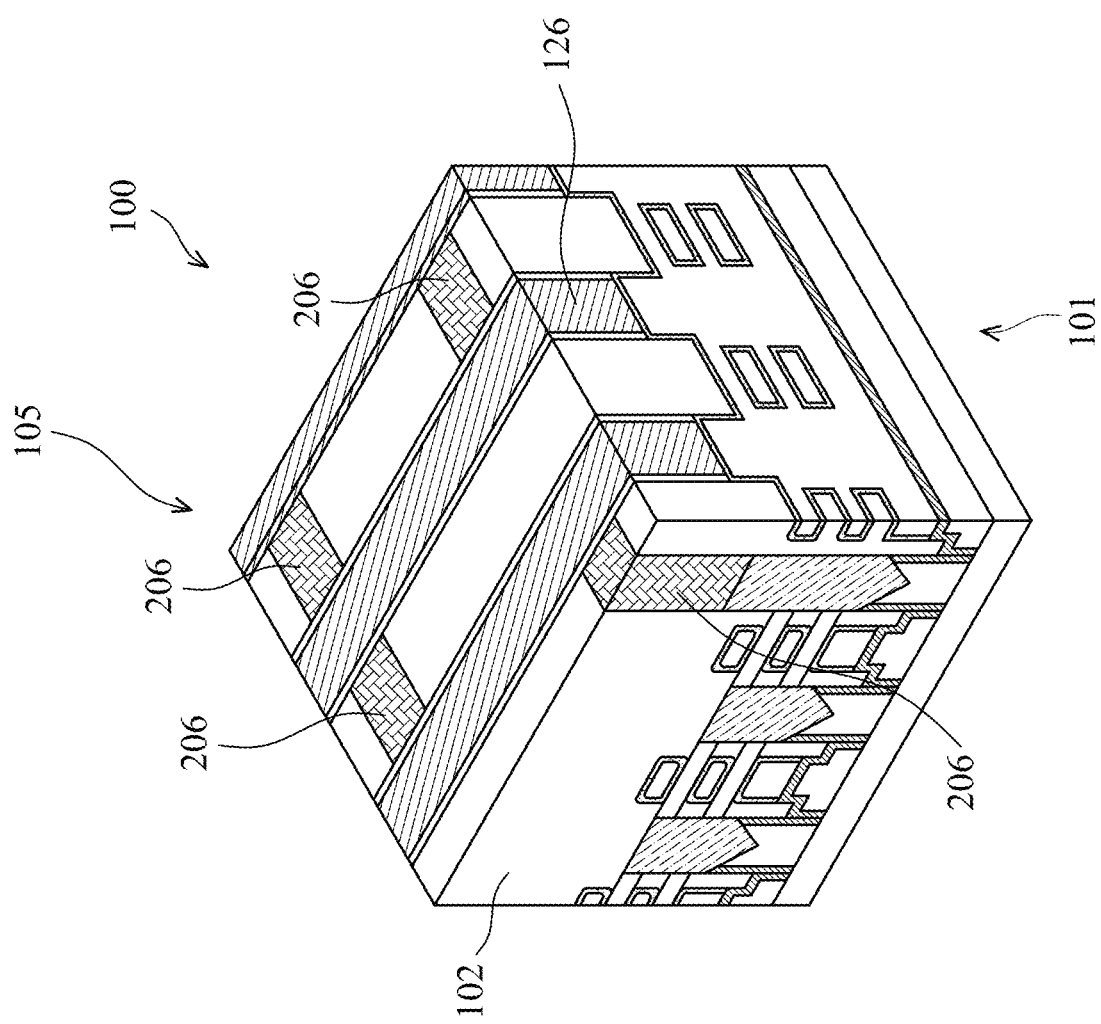

As shown in FIG. 3G, the integrated circuit 100 is flipped upside-down and processing is performed on the backside of the integrated circuit 100. More particularly, portions of the substrate 102 are removed by a cutting process. In some embodiments, the cutting process exposes the semiconductor regions 206 and the shallow trench isolation regions 126. The cutting process can include one or more of a dry etching process, a wet etching process, and a chemical mechanical planarization (CMP) process.

Figure 3H:
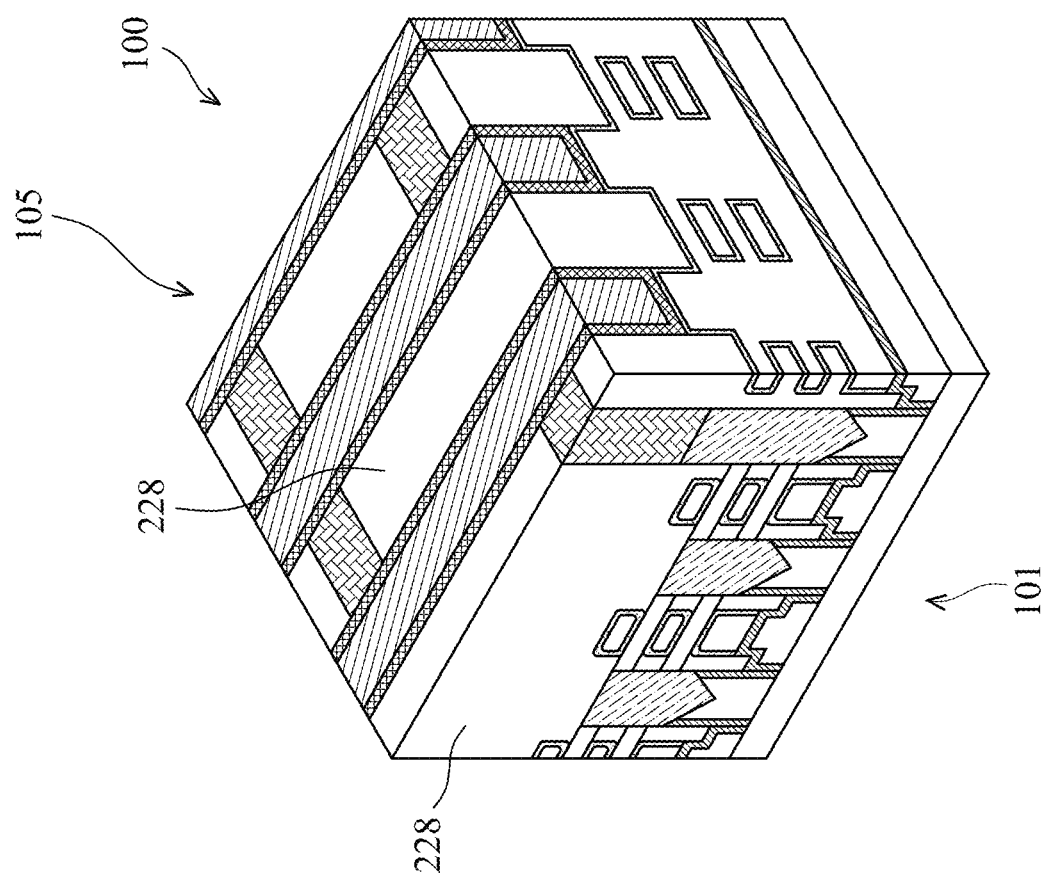

As shown in FIG. 3H, remaining portions of the substrate 102, which may be a silicon substrate, are removed. The substrate 102 may be removed by any suitable technique. In some embodiments, the substrate 102 is removed by an etching process. The etching process can be performed in one or more steps. The etching process may include selectively etching the substrate 102 with respect to the materials of the shallow trench isolation regions 126 and the semiconductor regions 206, such that the shallow trench isolation regions 126 and the semiconductor regions 206 remain protruding above substantially unchanged while the remaining portions of the substrate 102 have been recessed or removed. The etching steps can include wet etches, dry etches, timed etches, or other types of etching processes.

Further, as shown in FIG. 3H, a dielectric material 228 is formed in the recesses that are formed by the removal of the remaining portions of the substrate 102. The dielectric material 228 may be any suitable dielectric material. In some embodiments, the dielectric material 228 is or includes $SiO_xN_yC_z$ or other dielectrics, and in some embodiments, the dielectric material 228 is SiN. The dielectric material 228 may be formed, in some embodiments, by a deposition process. After formation of the dielectric material 228, the upper surface of the integrated circuit 100 (as shown in FIG. 3H) may be planarized by a chemical mechanical planarization (CMP) process.

Figure 3I:
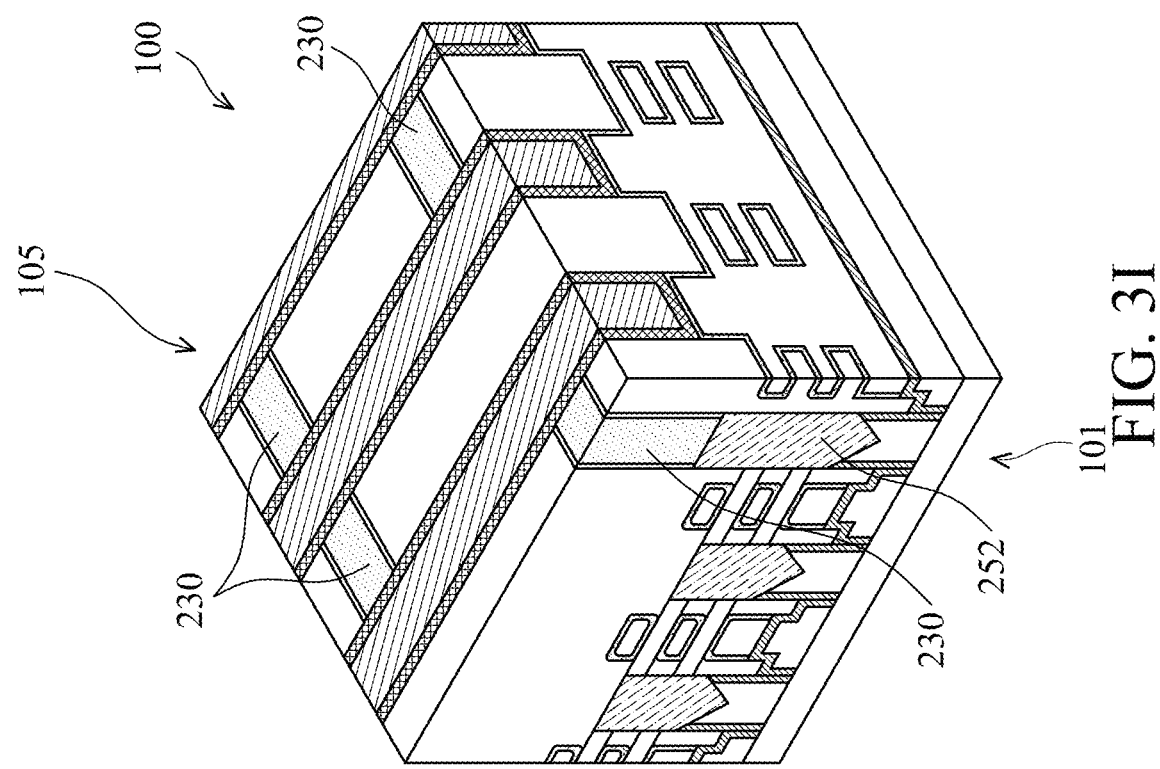

As shown in FIG. 3I, the semiconductor regions 206 may be removed. The semiconductor regions 206 may be removed by any suitable technique. In some embodiments, the semiconductor regions 206 are removed by an etching process or etching steps. The etching process may include selectively etching the semiconductor regions 206 with respect to the adjacent materials, such as the dielectric material 228, such that the dielectric material 228 remains protruding above substantially unchanged while the semiconductor regions 206 have been recessed or removed. The etching steps can include wet etches, dry etches, timed etches, or other types of etching processes.

Backside source/drain plugs 230 are formed in the recesses that are formed by the removal of the semiconductor regions 206. The backside source/drain plugs 230 may be formed of any suitable electrically conductive material. In some embodiments, the backside source/drain plugs 230 are formed of Ru, W, Co, Al, or Mo, or any compounds including Ru, W, Co, Al, or Mo. In some embodiments, the backside source/drain plugs 230 may be formed on a liner, which may include Ti, Ta, TiN, or TaN. In some embodiments, the liner is optional. The backside source/drain plugs 230 may be formed, in some embodiments, by a deposition process. As shown in FIG. 3I, the backside source/drain plugs 230 may contact the source/drain regions 252. The backside source/drain plugs 230 are electrically or conductively coupled to the source/drain regions 252.

Figure 3J:
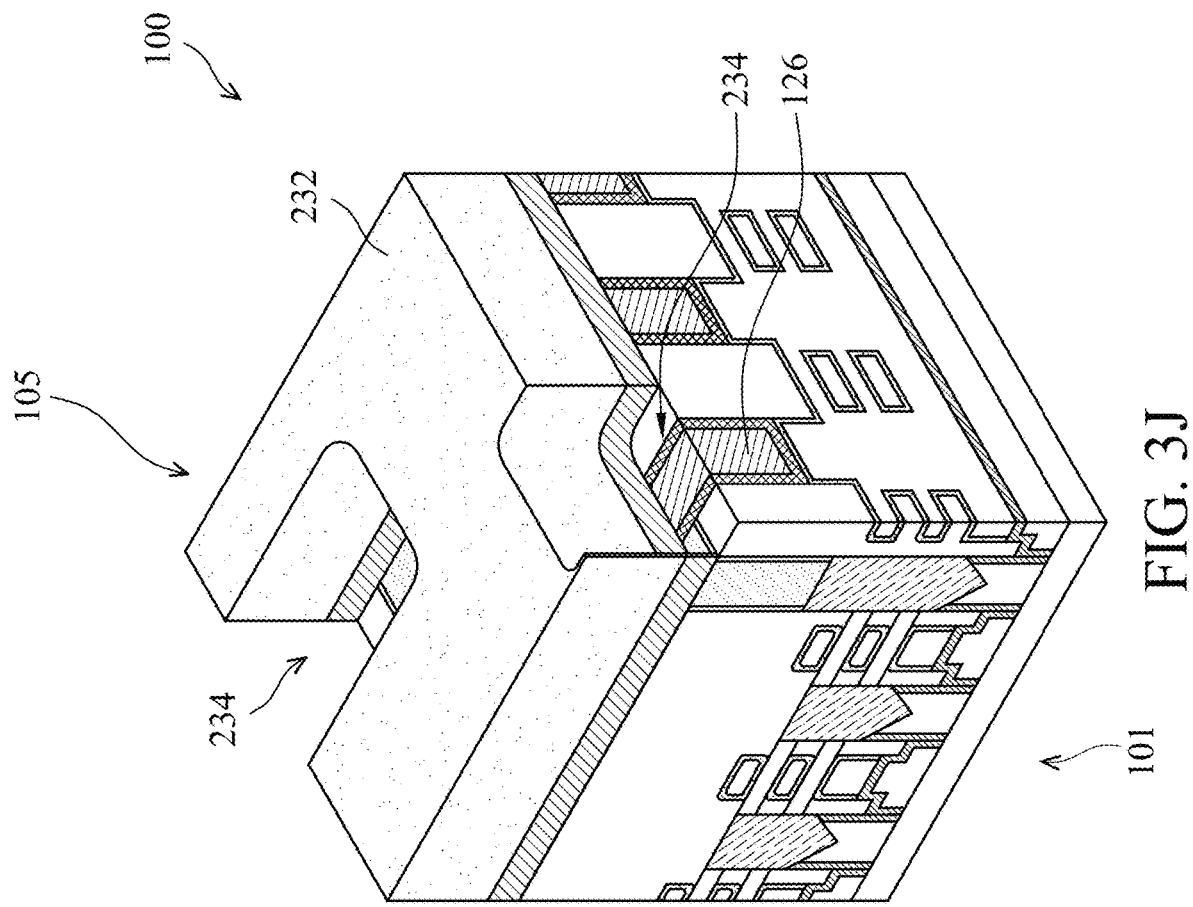

As shown in FIG. 3J, a patterned hard mask 232 is formed on the upper surface of the integrated circuit 100. The patterned hard mask 232 may be formed by any suitable techniques, including by depositing a hard mask on the upper surface of the integrated circuit 100 and patterning and etching the hard mask using standard photolithography processes. The patterned hard mask 232 includes openings 234 which expose portions of the shallow trench isolation regions 126.

Figure 3K:
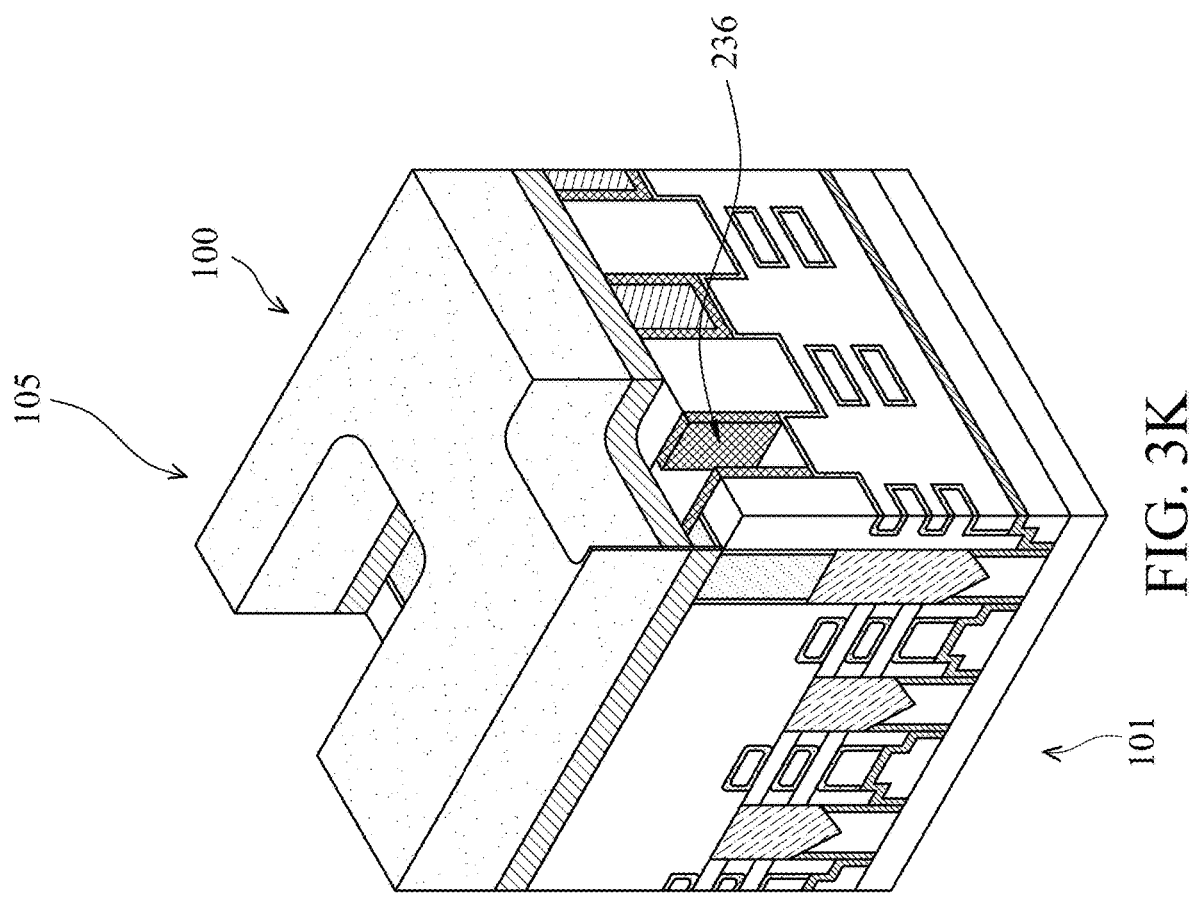

As shown in FIG. 3K, the portions of the shallow trench isolation regions 126 that are exposed through the openings in the patterned hard mask 232 are selectively removed. The shallow trench isolation regions 126 may be selectively removed by any suitable technique, including by an etching process. In some embodiments, the shallow trench isolation regions 126 are selectively removed by an etching process utilizing an etchant gas. The etchant gas may include one or more of Cl, F, or HBr. Recesses 236 are formed by the selective removal of the portions of the shallow trench isolation regions 126.

Figure 3L:
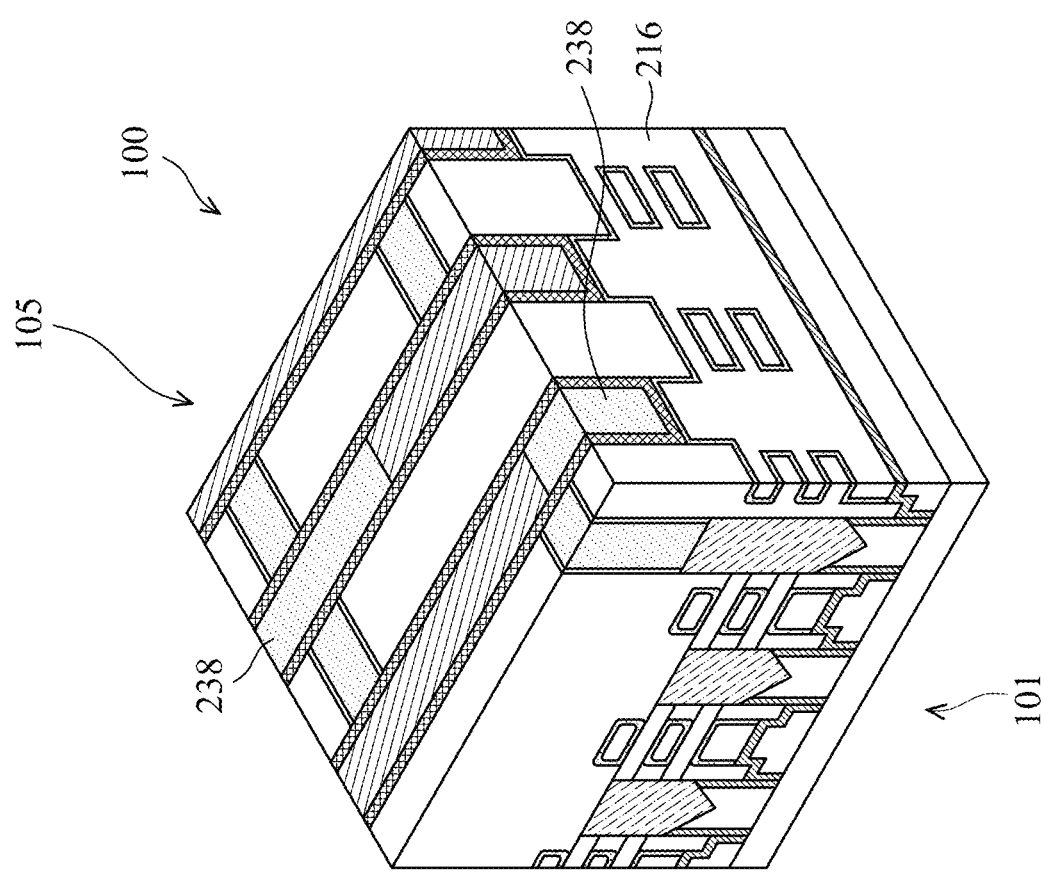

As shown in FIG. 3L, backside metal gate plugs 238 are formed in the recesses 236 that are formed by the removal of the shallow trench isolation regions 126. The backside metal gate plugs 238 may be formed of any suitable electrically conductive material. In some embodiments, the backside metal gate plugs 238 are formed of Ru, W, Co, Al, or Mo, or any compounds including Ru, W, Co, Al, or Mo. In some embodiments, the backside metal gate plugs 238 may be formed on a liner, which may include Ti, Ta, TiN, or TaN. In some embodiments, the liner is optional. The backside metal gate plugs 238 may be formed, in some embodiments, by a deposition process. As shown in FIG. 3L, the backside metal gate plugs 238 may contact the gate electrode 216. The backside metal gate plugs 238 are electrically or conductively coupled to the gate electrode 216. In some embodiments, two or more gate electrodes 216 (e.g., gate electrodes for two or more transistors) are electrically connected to one another by one of the backside metal gate plugs 238.

The integrated circuit 100 shown in FIG. 1 is complete at the completion of the process shown in FIG. 3L.

Embodiments of the present disclosure provide integrated circuits and methods of manufacturing integrated circuits in which backside metal gate plugs are formed extending into the integrated circuits from a backside thereof. The integrated circuit includes one or more transistors. The transistors each have a plurality of nanostructures formed over a substrate. The nanostructures act as channel regions of the transistor. Each transistor includes a gate electrode over the channel region. The backside metal gate plugs contact gate electrodes of one or more of the transistors of the integrated circuit. In some embodiments, backside source/drain plugs are formed which extend into the integrated circuit from the backside and contact source/drain regions of the transistors. By forming the backside metal gate plugs and the backside source/drain plugs at the backside of the integrated circuit, metal routing with the gate electrodes may be performed at the backside of the integrated circuit. This results in a reduction of routing density at the front side of the integrated circuit, which facilitates miniaturization of the integrated circuit. Furthermore, the reduction of routing density reduces or eliminates current leakage or short-circuits between metal lines that would otherwise exist if the metal lines are too close to one another, for example, if the metal lines are all formed at the front side of the integrated circuit.

In some embodiments, an integrated circuit includes a substrate at a front side of the integrated circuit. A first gate all around transistor is disposed on the substrate. The first gate all around transistor includes a channel region including at least one semiconductor nanostructure, source/drain regions arranged at opposite sides of the channel region, and a gate electrode. A shallow trench isolation region extends into the integrated circuit from the backside. A backside gate plug extends into the integrated circuit from the backside and contacts the gate electrode of the first gate all around transistor. The backside gate plug laterally contacts the shallow trench isolation region at the backside of the integrated circuit.

In some embodiments, a method includes forming a first gate all around transistor of a semiconductor device. The first gate all around transistor is disposed on a substrate at a front side of the semiconductor device, and the first gate all around transistor includes at least one semiconductor nanostructure, source/drain regions arranged at opposite sides of the channel region, and a gate electrode. A second gate all around transistor of the semiconductor device is formed, and the second gate all around transistor is disposed on the substrate at the front side of the semiconductor device. The second gate all around transistor includes at least one semiconductor nanostructure, source/drain regions arranged at opposite sides of the channel region, and a gate electrode. A shallow trench isolation region is formed extending into the semiconductor device from a backside of the semiconductor device that is opposite the front side. A backside gate plug is formed extending into the integrated circuit from the backside and contacts the gate electrode of the first gate all around transistor. The backside gate plug laterally contacts the shallow trench isolation region at the backside of the semiconductor device.

In some embodiments, a method includes forming a shallow trench isolation structure in a semiconductor device structure. The shallow trench isolation structure extends into the semiconductor device structure from a front side of the semiconductor device structure. A plurality of nanostructures of a first gate all around transistor are formed in the semiconductor device structure. Source/drain regions are formed at opposite sides of each of the plurality of nanostructures. The shallow trench isolation structure is exposed by reducing a thickness of the semiconductor device structure from a backside of the semiconductor device structure. A backside gate plug is formed extending into the semiconductor device structure from the backside and contacts a gate electrode of the first gate all around transistor. The backside gate plug laterally contacts the shallow trench isolation region at the backside of the semiconductor device structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first gate all around transistor on a front side of a substrate, the first gate all around transistor including at least one semiconductor nanostructure, source/drain regions arranged at opposite sides of the semiconductor nanostructure, and a gate electrode;
   forming a second gate all around transistor of the semiconductor device, the second gate all around transistor disposed on the substrate at the front side of the semiconductor device, the second gate all around transistor including at least one semiconductor nanostructure, source/drain regions arranged at opposite sides of the semiconductor nanostructure, and a gate electrode;
   forming a shallow trench isolation region extending into the semiconductor device from a backside of the substrate that is opposite the front side; and
   forming a backside gate plug extending into the substrate from the backside of the substrate and contacting the gate electrode of the first gate all around transistor, the backside gate plug laterally contacting the shallow trench isolation region at the backside of the substrate, wherein the forming the backside gate plug includes forming the backside gate plug in contact with the gate electrode of the second gate all around transistor.

2. The method of claim 1, further comprising removing, from the backside of the substrate, a semiconductor layer of the substrate before forming the backside gate plug.

3. The method of claim 2, further comprising replacing the removed semiconductor layer with a first dielectric layer by depositing the first dielectric layer in the substrate via the backside of the substrate.

4. The method of claim 1, further comprising forming a backside source/drain plug extending into the substrate from the backside of the substrate and contacting at least one of the source/drain regions of the first gate all around transistor.

5. The method of claim 4, further comprising forming a second dielectric layer contacting the backside gate plug and the backside source/drain plug at the backside of the substrate, wherein the backside source/drain plug and the backside gate plug are laterally separated from one another by the second dielectric layer.

6. The method of claim 5, comprising electrically coupling the backside gate plug to the backside source/drain plug.

7. A method, comprising:
   forming a shallow trench isolation structure in a semiconductor device structure, the shallow trench isolation structure extending into the semiconductor device structure from a backside of the semiconductor device structure;
   forming a plurality of nanostructures of a first gate all around transistor in the semiconductor device structure;
   forming source/drain regions at opposite sides of each of the plurality of nanostructures;
   exposing the shallow trench isolation structure by reducing a thickness of the semiconductor device structure from the backside of the semiconductor device structure; and
   forming a backside gate plug extending into the semiconductor device structure from the backside of the semiconductor device structure and contacting a gate electrode of the first gate all around transistor, the backside gate plug laterally contacting the shallow trench isolation region at the backside of the semiconductor device structure.

8. The method of claim 7, wherein the forming the backside gate plug includes:
   forming a recess by selectively removing a portion of the shallow trench isolation structure; and
   forming the backside gate plug in the recess.

9. The method of claim 7, further comprising:
   forming recesses by removing portions of a semiconductor substrate from the backside of the semiconductor device structure; and
   filling the recesses with a dielectric layer.

10. The method of claim 9, further comprising:
    forming a backside source/drain plug extending into the dielectric layer from the backside of the semiconductor device structure, the backside source/drain plug contacting at least one of the source/drain regions of the first gate all around transistor.

11. The method of claim 10, comprising electrically coupling the backside gate plug to the backside source/drain plug.

12. The method of claim 7, further comprising:
forming a plurality of nanostructures of a second gate all around transistor in the semiconductor device structure,
wherein the forming the backside gate plug includes forming the backside gate plug in contact with a gate electrode of the second gate all around transistor.

13. A method, comprising:
forming, on a front side of a substrate, a channel region of a first gate all around transistor including at least one semiconductor nanostructure;
forming source/drain regions of the first gate all around transistor arranged at opposite sides of the channel region; and
forming a gate electrode of the first gate all around transistor;
forming a shallow trench isolation region in the substrate; and
forming a backside gate plug in the substrate extending from a backside of the substrate and contacting the gate electrode of the first gate all around transistor, the backside gate plug laterally contacting the shallow trench isolation region at the backside of the substrate, wherein the substrate is a dielectric layer.

14. The method of claim 13, further comprising forming a backside source/drain plug in the substrate from the backside of the substrate and contacting at least one of the source/drain regions of the first gate all around transistor.

15. The method of claim 14, further comprising forming a dielectric liner layer contacting the backside gate plug and the backside source/drain plug at the backside of the substrate, wherein the backside source/drain plug and the backside gate plug are laterally separated from one another by the dielectric liner layer.

16. The method of claim 15, wherein the dielectric liner layer has a lateral thickness between the backside source/drain plug and the backside gate plug within a range from 4 nm to 10 nm.

17. The method of claim 14, comprising electrically coupling the backside source/drain plug to the backside gate plug.

18. The method of claim 13, further comprising:
forming a dielectric liner layer at the backside of the substrate, the dielectric liner layer disposed directly between the shallow trench isolation region and the dielectric layer.

19. The method of claim 13, wherein the shallow trench isolation region has a width within a range from 10 nm to 100 nm.

20. The method of claim 13, further comprising:
forming a second gate all around transistor on the front side of the substrate, the second gate all around transistor including:
a channel region including at least one semiconductor nanostructure;
source/drain regions arranged at opposite sides of the channel region; and
a gate electrode, wherein the backside gate plug contacts the gate electrodes of both the first and second transistors.

* * * * *